United States Patent
Fayneh et al.

(10) Patent No.: US 11,929,131 B2
(45) Date of Patent: Mar. 12, 2024

(54) MEMORY DEVICE DEGRADATION MONITORING

(71) Applicant: PROTEANTECS LTD., Haifa (IL)

(72) Inventors: Eyal Fayneh, Givatayim (IL); Guy Redler, Haifa (IL); Evelyn Landman, Haifa (IL)

(73) Assignee: PROTEANTECS LTD., Haifa (IL)

( * ) Notice: Subject to any disclaimer, the term of this patent is extended or adjusted under 35 U.S.C. 154(b) by 34 days.

(21) Appl. No.: 17/782,146

(22) PCT Filed: Dec. 3, 2020

(86) PCT No.: PCT/IL2020/051246
§ 371 (c)(1),
(2) Date: Jun. 2, 2022

(87) PCT Pub. No.: WO2021/111444
PCT Pub. Date: Jun. 10, 2021

(65) Prior Publication Data
US 2023/0009637 A1    Jan. 12, 2023

Related U.S. Application Data

(60) Provisional application No. 62/943,322, filed on Dec. 4, 2019.

(51) Int. Cl.
*G11C 11/419* (2006.01)
*G11C 29/08* (2006.01)

(52) U.S. Cl.
CPC ............ *G11C 29/08* (2013.01); *G11C 11/419* (2013.01)

(58) Field of Classification Search
CPC .................................................. G11C 11/419
See application file for complete search history.

(56) References Cited

U.S. PATENT DOCUMENTS 4,555,663 A    11/1985  Shimizu
5,548,539 A    8/1996   Vlach
(Continued)

FOREIGN PATENT DOCUMENTS

CN    101014991 A    8/2007
CN    101344898 A    1/2009
(Continued)

OTHER PUBLICATIONS

Zheng K., "A Comparison of Digital Droop Detection Techniques in ASAP7 FinFET"; Research Review. Sep. 2019.
(Continued)

*Primary Examiner* — Jason Lappas
(74) *Attorney, Agent, or Firm* — The Roy Gross Law Firm, LLC; Roy Gross

(57) ABSTRACT

A memory circuit which includes: A synchronous memory cell array, configured to receive a clock signal and having address lines and bit lines. A margin agent, determining a status of the synchronous memory cell array based on a time duration between a transition of the clock signal and a change on a signal derived from a bit line due to a signaling on at least one of the address lines. In another aspect, a memory cell, having a bit line configured to provide data input/output to the memory cell may be provided with a comparator, comparing a voltage on the bit line with a reference voltage and indicating of a status of the memory cell thereby. Firmware may receive the indication of the status of a memory cell array, and transmit the indication, issue an alert, and/or reconfigure the memory circuit responsive to the status.

22 Claims, 12 Drawing Sheets

(56) References Cited

U.S. PATENT DOCUMENTS

| | | |
|---|---|---|
| 5,748,509 A | 5/1998 | Fewster |
| 5,774,403 A | 6/1998 | Clark, II et al. |
| 5,818,251 A | 10/1998 | Intrater |
| 5,895,629 A | 4/1999 | Russell et al. |
| 5,956,497 A | 9/1999 | Ratzel et al. |
| 5,966,527 A | 10/1999 | Krivokapic et al. |
| 6,172,546 B1 | 1/2001 | Liu et al. |
| 6,182,253 B1 | 1/2001 | Lawrence et al. |
| 6,486,716 B1 | 11/2002 | Minami et al. |
| 6,586,921 B1 | 7/2003 | Sunter |
| 6,683,484 B1 | 1/2004 | Kueng et al. |
| 6,807,503 B2 | 10/2004 | Ye et al. |
| 6,873,926 B1 | 3/2005 | Diab |
| 6,882,172 B1 | 4/2005 | Suzuki et al. |
| 6,948,388 B1 | 9/2005 | Clayton et al. |
| 7,038,483 B1 | 5/2006 | Suzuki et al. |
| 7,067,335 B2 | 6/2006 | Weiner et al. |
| 7,254,507 B2 | 8/2007 | Dosho et al. |
| 7,369,893 B2 | 5/2008 | Gunderson |
| 7,443,189 B2 | 10/2008 | Ramappa |
| 7,455,450 B2 | 11/2008 | Liu et al. |
| 7,501,832 B2 | 3/2009 | Spuhler et al. |
| 7,649,373 B2 | 1/2010 | Tokunaga |
| 7,701,246 B1 | 4/2010 | Plants et al. |
| 7,818,601 B2 | 10/2010 | LaBerge |
| 7,877,657 B1 | 1/2011 | Miller et al. |
| 7,940,862 B2 | 5/2011 | Tanaka et al. |
| 8,001,512 B1 | 8/2011 | White |
| 8,086,978 B2 | 12/2011 | Zhang et al. |
| 8,279,976 B2 | 10/2012 | Lin et al. |
| 8,310,265 B2 | 11/2012 | Zjajo et al. |
| 8,365,115 B2 | 1/2013 | Liu et al. |
| 8,418,103 B2 | 4/2013 | Wang et al. |
| 8,479,130 B1 | 7/2013 | Zhang et al. |
| 8,633,722 B1 | 1/2014 | Lai |
| 8,825,158 B2 | 9/2014 | Swerdlow |
| 9,275,706 B2 | 3/2016 | Tam |
| 9,424,952 B1 | 8/2016 | Seok et al. |
| 9,490,787 B1 | 11/2016 | Kho et al. |
| 9,536,038 B1 | 1/2017 | Quinton et al. |
| 9,564,883 B1 | 2/2017 | Quinton et al. |
| 9,564,884 B1 | 2/2017 | Quinton et al. |
| 9,632,126 B2 | 4/2017 | Yoon et al. |
| 9,714,966 B2 | 7/2017 | Chen et al. |
| 9,760,672 B1 | 9/2017 | Taneja et al. |
| 9,791,834 B1 | 10/2017 | Nassar et al. |
| 9,954,455 B2 | 4/2018 | Lin et al. |
| 9,991,879 B2 | 6/2018 | Huang |
| 10,490,547 B1 | 11/2019 | Ali et al. |
| 10,509,104 B1 | 12/2019 | Dato |
| 10,530,347 B2 | 1/2020 | Tang et al. |
| 11,081,193 B1 | 8/2021 | Tang |
| 11,409,323 B2 | 8/2022 | Herberholz et al. |
| 2004/0009616 A1 | 1/2004 | Huisman et al. |
| 2004/0015793 A1 | 1/2004 | Saxena et al. |
| 2004/0230385 A1 | 11/2004 | Bechhoefer et al. |
| 2004/0230396 A1 | 11/2004 | Ye |
| 2005/0053162 A1 | 3/2005 | Goishi |
| 2005/0104175 A1 | 5/2005 | Itano et al. |
| 2005/0114056 A1 | 5/2005 | Patel et al. |
| 2005/0134350 A1 | 6/2005 | Huang et al. |
| 2005/0134394 A1 | 6/2005 | Liu |
| 2005/0154552 A1 | 7/2005 | Stroud et al. |
| 2006/0049886 A1 | 3/2006 | Agostinelli, Jr. et al. |
| 2006/0224374 A1 | 10/2006 | Kwon et al. |
| 2007/0110199 A1 | 5/2007 | Momtaz et al. |
| 2007/0182456 A1 | 8/2007 | Agarwal et al. |
| 2007/0288183 A1 | 12/2007 | Bulkes et al. |
| 2008/0074521 A1 | 3/2008 | Olsen |
| 2008/0144243 A1 | 6/2008 | Mariani et al. |
| 2008/0147355 A1 | 6/2008 | Fields et al. |
| 2008/0183409 A1 | 7/2008 | Roberts |
| 2008/0186001 A1 | 8/2008 | Singh et al. |
| 2008/0186044 A1 | 8/2008 | Singh |
| 2008/0262769 A1 | 10/2008 | Kadosh et al. |
| 2009/0027077 A1 | 1/2009 | Vijayaraghavan et al. |
| 2009/0076753 A1 | 3/2009 | Vijayaraghavan et al. |
| 2009/0096495 A1 | 4/2009 | Keigo |
| 2009/0183043 A1 | 7/2009 | Niwa |
| 2009/0230947 A1 | 9/2009 | Sumita |
| 2009/0244998 A1 | 10/2009 | Kim |
| 2009/0273550 A1 | 11/2009 | Vieri et al. |
| 2009/0278576 A1 | 11/2009 | Chakravarty |
| 2009/0306953 A1 | 12/2009 | Liu et al. |
| 2010/0153896 A1 | 6/2010 | Sewall et al. |
| 2010/0251046 A1 | 9/2010 | Mizuno et al. |
| 2010/0253382 A1 | 10/2010 | Wang et al. |
| 2011/0093830 A1 | 4/2011 | Chen et al. |
| 2011/0102091 A1 | 5/2011 | Yeric |
| 2011/0109377 A1 | 5/2011 | Fujibe et al. |
| 2011/0113298 A1 | 5/2011 | Van Den Eijnden |
| 2011/0187433 A1 | 8/2011 | Baumann et al. |
| 2011/0267096 A1 | 11/2011 | Chlipala et al. |
| 2011/0295403 A1 | 12/2011 | Higuchi et al. |
| 2011/0315986 A1 | 12/2011 | Kaneda et al. |
| 2012/0025846 A1 | 2/2012 | Minas et al. |
| 2012/0038388 A1 | 2/2012 | Tseng et al. |
| 2012/0063524 A1 | 3/2012 | Stott et al. |
| 2012/0074973 A1 | 3/2012 | Baldwin et al. |
| 2012/0163074 A1 | 6/2012 | Franca-Neto et al. |
| 2012/0187991 A1 | 7/2012 | Sathe |
| 2012/0212246 A1 | 8/2012 | Benjamin et al. |
| 2012/0217976 A1 | 8/2012 | Clarkson |
| 2012/0221906 A1 | 8/2012 | Shetty et al. |
| 2012/0242490 A1 | 9/2012 | Ramaswami |
| 2013/0088256 A1 | 4/2013 | Chlipala et al. |
| 2013/0226491 A1 | 8/2013 | Miguelanez, II et al. |
| 2013/0293270 A1 | 11/2013 | Lee et al. |
| 2013/0335875 A1 | 12/2013 | Baumann |
| 2014/0132293 A1 | 5/2014 | Abadir et al. |
| 2014/0184243 A1 | 7/2014 | Iyer et al. |
| 2014/0254734 A1 | 9/2014 | Abdelmoneum |
| 2015/0061707 A1 | 3/2015 | Balasubramanian et al. |
| 2015/0077136 A1 | 3/2015 | Li |
| 2015/0121158 A1 | 4/2015 | Wang et al. |
| 2015/0199223 A1 | 7/2015 | Banerjee et al. |
| 2015/0332451 A1 | 11/2015 | Amzaleg |
| 2015/0365049 A1 | 12/2015 | Ozawa et al. |
| 2016/0042784 A1 | 2/2016 | Rim et al. |
| 2016/0072511 A1 | 3/2016 | Maekawa |
| 2016/0087643 A1 | 3/2016 | Nozaki |
| 2016/0131708 A1 | 5/2016 | Huang et al. |
| 2016/0153840 A1 | 6/2016 | Huang et al. |
| 2016/0156176 A1 | 6/2016 | Kunz, Jr. et al. |
| 2016/0164503 A1 | 6/2016 | Kim et al. |
| 2016/0203036 A1 | 7/2016 | Mezic et al. |
| 2016/0254804 A1 | 9/2016 | Meng |
| 2017/0038265 A1 | 2/2017 | Abdelmoneum et al. |
| 2017/0093399 A1 | 3/2017 | Atkinson et al. |
| 2017/0179173 A1 | 6/2017 | Mandai et al. |
| 2017/0199089 A1 | 7/2017 | Fritchman et al. |
| 2017/0199228 A1 | 7/2017 | Hsieh et al. |
| 2017/0214516 A1 | 7/2017 | Rivaud et al. |
| 2017/0329391 A1 | 11/2017 | Jaffari |
| 2017/0344102 A1 | 11/2017 | Kolla |
| 2017/0345490 A1 | 11/2017 | Yoshimoto et al. |
| 2017/0364818 A1 | 12/2017 | Wu et al. |
| 2018/0034549 A1 | 2/2018 | Kikuchi |
| 2018/0183413 A1 | 6/2018 | Wong |
| 2018/0365974 A1 | 12/2018 | Haas et al. |
| 2019/0019096 A1 | 1/2019 | Yoshida et al. |
| 2019/0117122 A1 | 4/2019 | Kurachi et al. |
| 2019/0237135 A1* | 8/2019 | Madhavan ............ G11C 11/419 |
| 2019/0305074 A1 | 10/2019 | Kande et al. |
| 2020/0028514 A1 | 1/2020 | Hanke |
| 2020/0203333 A1 | 6/2020 | Chen et al. |
| 2022/0260630 A1 | 8/2022 | Fayneh et al. |
| 2022/0349935 A1 | 11/2022 | Fayneh et al. |
| 2023/0098071 A1 | 3/2023 | Chonnad et al. |

FOREIGN PATENT DOCUMENTS

| | | |
|---|---|---|
| CN | 102273077 B | 9/2014 |
| CN | 102422169 A | 11/2014 |

(56) References Cited

FOREIGN PATENT DOCUMENTS

| | | |
|---|---|---|
| CN | 105210188 A | 12/2015 |
| CN | 106959400 A | 7/2017 |
| CN | 108534866 A | 9/2018 |
| CN | 113466670 A | 10/2021 |
| DE | 102012219971 A1 | 5/2013 |
| EP | 2006784 A1 | 12/2008 |
| EP | 2060924 A1 | 5/2009 |
| EP | 2413150 A1 | 2/2012 |
| JP | 2000215693 A | 8/2000 |
| JP | 2002243800 A | 8/2002 |
| JP | 2008147245 A | 6/2008 |
| JP | 2009065533 A | 3/2009 |
| JP | 2009021348 A | 7/2013 |
| KR | 2013110989 A | 10/2013 |
| KR | 20150073199 A | 6/2015 |
| TW | 201614256 A | 3/2016 |
| WO | 2005080099 A1 | 9/2005 |
| WO | 2013027739 A1 | 2/2013 |
| WO | 2019097516 A1 | 5/2019 |
| WO | 2019102467 A1 | 5/2019 |
| WO | 2019135247 A1 | 7/2019 |
| WO | 2019202595 A1 | 10/2019 |
| WO | 2019244154 A1 | 12/2019 |
| WO | 2020141516 A1 | 7/2020 |
| WO | 2020230130 A1 | 11/2020 |
| WO | 2021019539 A1 | 2/2021 |
| WO | 2021214562 A1 | 10/2021 |
| WO | 2022/009199 A1 | 1/2022 |
| WO | 2022215076 A1 | 10/2022 |
| WO | 2023238128 A1 | 12/2023 |

OTHER PUBLICATIONS

Hongge Chen, "Novel Machine Learning Approaches for Modeling Variations in Semiconductor Manufacturing," Master thesis, Jun. 2017.

Nidhal Selmane, Shivam Bhasin, Sylvain Guilley, Tarik Graba, Jean-Luc Danger. "WDDL is Protected Against Setup Time Violation Attacks." CHES, Sep. 2009, Lausanne, Switzerland. pp. 73-83. DOI:10.1109/FDTC.2009.40.

Nidhal Selmane, Shivam Bhasin, Sylvain Guilley, Jean-Luc Danger. "Security evaluation of application-specific integrated circuits and field programmable gate arrays against setup time violation attacks." IET Inf. Secur., 2011, vol. 5, Iss. 4, pp. 181-190. doi: 10.1049/iet-ifs.2010.0238.

Jianfeng Zhang et al, "Parameter Variation Sensing and Estimation in Nanoscale Fabrics"; Journal of Parallel and Distributed Computing; vol. 74, Issue 6, pp. 2504-2511, Jun. 1, 2014. https://doi.org/10.1016/j.jpdc.2013.08.005.

I. A. K. M. Mahfuzul et al, "Variation-sensitive monitor circuits for estimation of Die-to-Die process variation"; 2011 IEEE ICMTS International Conference on Microelectronic Test Structures, Amsterdam, Netherlands; pp. 153-157, Apr. 4-7, 2011. doi: 10.1109/ICMTS.2011.5976878.

Ying Qiao et al, "Variability-aware compact modeling and statistical circuit validation on SRAM test array"; Proceedings of the SPIE, vol. 9781, Design-Process-Technology Co-optimization for Manufacturability X, Mar. 16, 2016. DOI: 10.1117/12.2219428.

David Herres, "The Eye Diagram: What is it and why is it used?"; Online at: https://www.testandmeasurementtips.com/basics-eye-diagrams/, Aug. 16, 2016.

Yu-Chuan Lin et al, "A 10-GB/s Eye-Opening Monitor Circuit for Receiver Equalizer Adaptations in 65-nm CMOS;" in IEEE Transactions on Very Large Scale Integration (VLSI) Systems, vol. 28, No. 1, pp. 23-34, Jan. 2020. doi: 10.1109/TVLSI.2019.2935305.

Kan Takeuchi et al; "FEOL/BEOL wear-out estimator using stress-to-frequency conversion of voltage/temperature-sensitive ring oscillators for 28nm automotive MCUs"; ESSCIRC Conference 2016: 42nd European Solid-State Circuits Conference, 2016, pp. 265-268, doi: 10.1109/ESSCIRC.2016.7598293.

Kan Takeuchi et al; "Wear-out stress monitor utilising temperature and voltage sensitive ring oscillators" IET Circuits, Devices & Systems. vol. 12 No. 2, pp. 182-188, Jan. 15, 2018. https://doi.org/10.1049/iet-cds.2017.0153.

Kan Takeuchi et al; "Experimental Implementation of 8.9Kgate Stress Monitor in 28nm MCU along with Safety Software Library for IoT Device Maintenance"; 2019 IEEE International Reliability Physics Symposium (IRPS), 2019, pp. 1-7, doi: 10.1109/IRPS.2019.8720583.

Dan Ernst et al; "Razor: circuit-level correction of timing errors for low-power operation"; in IEEE Micro, vol. 24, No. 6, pp. 10-20, Nov.-Dec. 2004, doi: 10.1109/MM.2004.85.

Dan Ernst et al; "Razor: A Low-Power Pipeline Based on Circuit-Level Timing Speculation"; Proceedings. 36th Annual IEEE/ACM International Symposium on Microarchitecture, 2003. MICRO-36., 2003, pp. 7-18, doi: 10.1109/MICRO.2003.1253179.

James P. Hofmeister, et al, "Ball Grid Array (BGA) Solder Joint Intermittency Detection: SJ BIST™", 2008 IEEE Aerospace Conference, 2008, pp. 1-11, doi: 10.1109/AERO.2008.4526624.

Paulheim, H & Meusel, R. "A decomposition of the outlier detection problem into a set of supervised learning problems", Machine Learning, Sep. 2015, vol. 100 Issue 2, pp. 509-531; https://doi.org/10.1007/s10994-015-5507-y.

Zhang L, Marron JS, Shen H, Zhu Z., "Singular value decomposition and its visualization", Journal of Computational and Graphical Statistics, Dec. 2007, vol. 6 Issue 4, pp. 833-854; https://www.stat.purdue.edu/~lingsong/research/ZhangJCGS.pdf.

Shinkai, Ken-ichi et al. "Device-parameter estimation with on-chip variation sensors considering random variability."; In 16th Asia and South Pacific Design Automation Conference (ASP-DAC 2011), pp. 683-688. IEEE, Jan. 25, 2011. doi: 10.1109/ASPDAC.2011.5722274.

Weiwei Shan et al. "An improved timing error prediction monitor for wide adaptive frequency scaling"; IEICE Electronics Express, vol. 14, No. 21, pp. 1-6, Oct. 20, 2017; https://doi.org/10.1587/elex.14.20170808.

Agilent Technologies; "Clock Jitter Analysis with femto-second resolution"; Jan. 1, 2008.

Yousuke Miyake et al; "Temperature and voltage estimation using ring-oscillator-based monitor for field test"; IEEE 23rd Asian Test Symposium; pp. 156-161, Nov. 16, 2014. doi: 10.1109/ATS.2014.38.

Basab Datta et al. "Analysis of a ring oscillator based on chip thermal sensor in 65nm technology"; Online at: https://web.archive.org/web/20140328234617/http://www-unix.ecs.umass.edu/~dkumar/lab4_658_report/lab4_report.htm; Sep. 5, 2018.

Tilman Wolf et al; "Collaborative Monitors for Embedded System Security". Jan. 1, 2006; https://www.researchgate.net/publication/228699010_Collaborative_Monitors_for_Embedded_System_Security.

Sandeep Kumar Samal et al; "Machine Learning Based Variation Modeling and Optimization for 3D ICs"; J. Inf. Commun. Converg. Eng. 14(4): 258-267, Dec. 2016. https://doi.org/10.6109/jicce.2016.14.4.258.

Yin-Nien Chen et al; "Impacts of Work Function Variation and Line-Edge Roughness on TFET and FinFET Devices and 32-Bit CLA Circuits"; J. Low Power Electron. Appl. 2015, 5, 101-115. May 21, 2015. DOI:10.3390/jlpea5020101.

Yong Zhao et al; "A Genetic Algorithm Based Remaining Lifetime Prediction for a VLIW Processor Employing Path Delay and IDDX Testing"; 2016 International Conference on Design and Technology of Integrated Systems in Nanoscale Era (DTIS), 2016, pp. 1-4, doi: 10.1109/DTIS.2016.7483805.

Vivek S Nandakumar et al, "Statistical static timing analysis flow for transistor level macros in a microprocessor"; 2010, 11th International Symposium on Quality Electronic Design (ISQED), pp. 163-170, Mar. 22, 2010. doi: 10.1109/ISQED.2010.5450412.

Jing Li et al, "Variation Estimation and Compensation Technique in Scaled LTPS TFT Circuits for Low-Power Low-Cost Applications"; IEEE Transactions on Computer-Aided Design of Integrated Circuits and Systems, vol. 28(1):46-59, Jan. 1, 2009. doi: 10.1109/TCAD.2008.2009149.

(56) References Cited

OTHER PUBLICATIONS

Xie Qing et al "Variation-Aware Joint Optimization of the Supply Voltage and Sleep Transistor Size for 7nm FinFET Technology"; 2014 IEEE 32nd international conference on computer design, pp. 380-385, Oct. 19, 2014. doi: 10.1109/ICCD.2014.6974709.

Rebaud, B. et al, "Timing slack monitoring under process and environmental variations: Application to a DSP performance optimization"; Microelectronics Journal vol. 42 Issue 5, pp. 718-732, Feb. 8, 2011. https://doi.org/10.1016/j.mejo.2011.02.005.

Dierickx, B. et al, "Propagating variability from technology to system Level"; 2007 International Workshop on Physics of Semiconductor Devices, 2007, pp. 74-79, doi: 10.1109/IWPSD.2007.4472457.

PCT International Search Report for International Application No. PCT/IL2020/051246, dated Mar. 7, 2021, 3pp.

PCT Written Opinion for International Application No. PCT/IL2020/051246, dated Mar. 7, 2021, 6pp.

\* cited by examiner

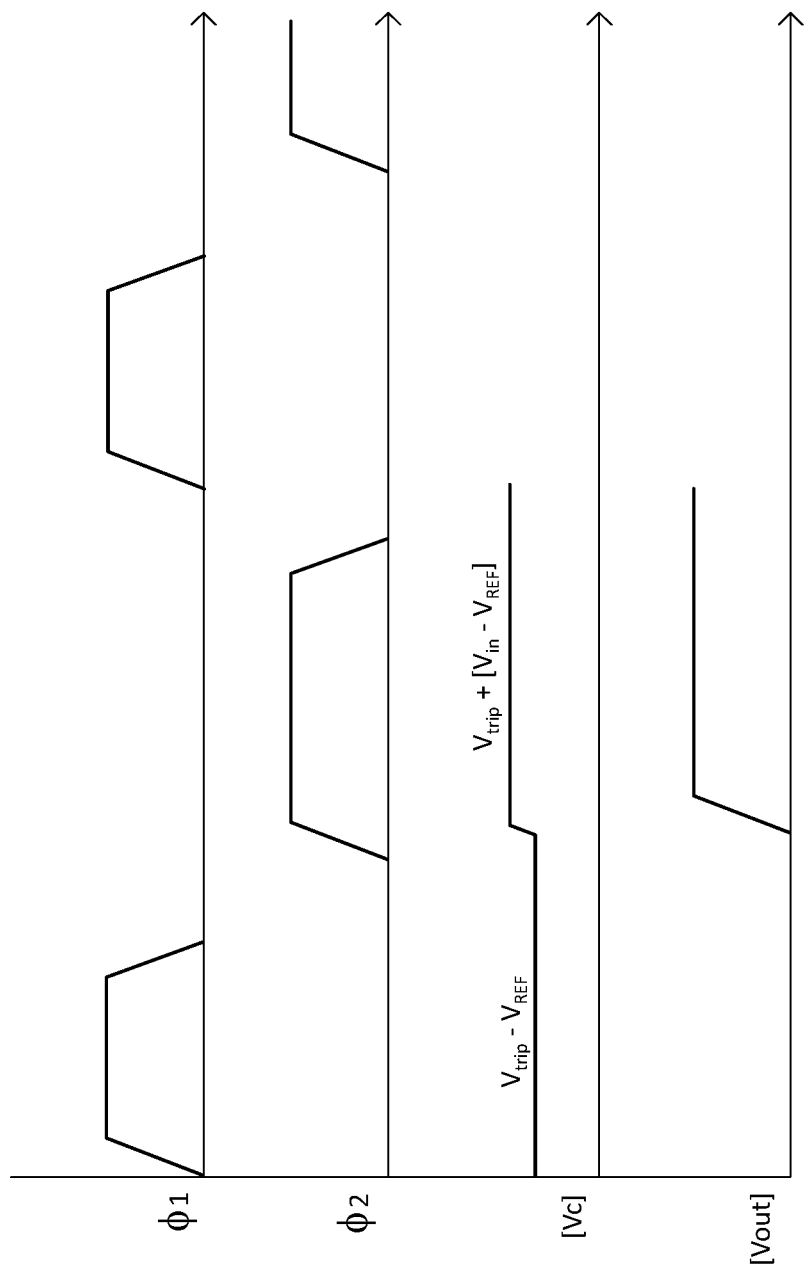

MEMORY DEVICE DEGRADATION MONITORING

CROSS-REFERENCE TO RELATED APPLICATIONS

This application is a National Phase of PCT Patent Application No. PCT/IL2020/051246 having International filing date of Dec. 3, 2020, which claims the benefit of priority of U.S. Provisional Patent Application No. 62/943,322, filed Dec. 4, 2019, and entitled "Memory Device Monitoring", the contents of which are incorporated herein by reference.

FIELD OF THE INVENTION

The invention relates to the field of integrated circuits and specifically memory devices, including Random Access Memory (RAM), Static RAM (SRAM), Dynamic RAM (DRAM), and Read Only Memory (ROM).

BACKGROUND

Integrated circuits (ICs) include analog and digital electronic circuits on a flat semiconductor substrate, such as a silicon wafer. Microscopic transistors are printed onto the substrate using photolithography techniques to produce complex circuits of billions of transistors in a very small area, making modern electronic circuit design using ICs both low cost and high performance. ICs are produced in assembly lines of factories, termed "foundries," which have commoditized the production of ICs, such as complementary metal-oxide-semiconductor (CMOS) IC s.

Digital ICs contain billions of transistors, such as metal-oxide-semiconductor field-effect transistor (MOSFETs), arranged in functional and/or logical units on the wafer, with datapaths interconnecting the functional units that transfer data values between the functional units. Each unit has a power source and an associated 'on' power, 'off' power, 'standby' power, and the like.

ICs sometimes include Random Access Memory (RAM), for example Static RAM (SRAM). RAM circuits may degrade over time, leading to failure of write and/or read operations. Monitoring such degradation is still considered a challenge.

The foregoing examples of the related art and limitations related therewith are intended to be illustrative and not exclusive. Other limitations of the related art will become apparent to those of skill in the art upon a reading of the specification and a study of the figures.

SUMMARY

The following embodiments and aspects thereof are described and illustrated in conjunction with systems, tools and methods which are meant to be exemplary and illustrative, not limiting in scope.

In one aspect, there may be provided a memory circuit, comprising: a synchronous memory cell array, configured to receive a clock signal and having address lines and bit lines; and a margin agent, configured to receive a signal derived from at least one of the bit lines and to determine a status indication of the synchronous memory cell array based on a time duration between a transition of the clock signal and a change on the received signal from at least one of the bit lines due to a signaling on at least one of the address lines.

In embodiments, the margin agent is configured to determine a time duration from the change on the received signal to a subsequent transition of the clock signal.

In embodiments, the memory circuit further comprises an output stage, coupled to the bit lines of the synchronous memory cell array, the margin agent being configured to receive the signal derived from at least one of the bit lines from the output stage. Optionally, the output stage comprises a sensing amplifier, configured to amplify a signal received from the bit lines of the synchronous memory cell array and further configured to receive a strobe signal that controls activation of the sensing amplifier at a predetermined time interval after selection of a read operation for the synchronous memory cell array. The margin agent may be configured to receive the signal derived from at least one of the bit lines from the sensing amplifier at a time that is after selection of the read operation by less than the predetermined time interval.

In embodiments, the memory circuit may further comprise: a comparator, configured to compare a voltage on one of the bit lines with a reference voltage and provide a comparator output, the margin agent being configured to receive the comparator output as the signal derived from at least one of the bit lines.

In another aspect, there may be considered a memory circuit, comprising: a memory cell, having a bit line configured to provide data input/output to the memory cell; and a comparator, configured to compare a voltage on the bit line with a reference voltage and provide a comparator output that is indicative of a status of the memory cell.

In embodiments, the reference voltage is adjustable.

In embodiments, the memory circuit further comprises: a controller, configured to adjust the reference voltage and identify a status of the memory cell based on the comparator output on adjustment of the reference voltage.

In embodiments, the controller is configured to determine a status value of the memory cell corresponding with the reference voltage associated with a change in the comparator output or with a higher value. Optionally, the controller is configured to store a plurality of status values of the memory cell, each stored status value of the reference voltage being measured at a respective time.

In embodiments, the memory cell has a standard bit line and an inverse bit line, a signal on the inverse bit line being the logical inverse of a signal on the standard bit line. Then, the memory circuit may further comprise a multiplexer, configured to selectively provide the signal on the standard bit line and the signal on the inverse bit line to the comparator, based on the signal on the standard bit line and/or the signal on the inverse bit line.

In embodiments, the memory circuit is a synchronous circuit having a clock signal. The memory circuit may further comprise a margin agent, configured to receive the comparator output and to determine a status indication of the memory cell based on a time duration between a transition of the clock signal and a change on the comparator output.

In embodiments, the memory circuit comprises a memory cell array formed of a plurality of memory cells, each memory cell having a respective bit line configured to provide data input/output to the respective memory cell and wherein the comparator is configured to compare a voltage on one or more of the bit lines with a reference voltage and provide a comparator output that is indicative of a status of one or more of the plurality of memory cells. Optionally, the memory circuit comprises a plurality of comparators, each comparator being configured to compare a voltage on a respective one or more of the bit lines with a respective reference voltage and provide a respective comparator output that is indicative of a status of a respective one or more of the plurality of memory cells. Optionally, the comparator or each of the comparators is positioned outside the memory cell array. Optionally, the memory circuit, further comprises: a precharge circuit coupled to the bit lines of the plurality of memory cells, the comparator or each of the comparators being positioned at or adjacent the precharge circuit.

In embodiments, the memory circuit further comprises: addressing circuitry configured to select a memory cell for a read or write operation.

In embodiments, the comparator or each of the comparators comprises an inverter-based amplifier. Optionally, the inverter-based amplifier comprises: an inverting amplifier, having an input and an output; a capacitor coupled at a first end to the input of the inverting amplifier; a first signal input port coupled to a second end of the capacitor via a first switch; a second signal input port coupled to the second end of the capacitor via a second switch; a feedback connection, coupling the output of the inverting amplifier to the input of the inverting amplifier via a third switch; and a controller, configured to activate the first and third switches at the same time and to activate the second switch when the first and third switches are deactivated. Optionally, the inverting amplifier is a first inverting amplifier having a threshold voltage. The memory circuit may further comprise a second inverting amplifier, configured to receive the output of the first inverting amplifier as an input. A threshold voltage of the second inverting amplifier may be equal to the threshold voltage of the first inverting amplifier.

In embodiments, the memory cell is Random Access Memory (RAM) cell and/or wherein the memory cell array is a Random Access Memory (RAM) cell. Optionally, the memory cell is a Static Random Access Memory (SRAM) cell and/or wherein the memory cell array is a Static Random Access Memory (SRAM) cell.

An aspect of the disclosure may be found in an Integrated Circuit (IC), comprising the memory circuit as herein disclosed.

A further aspect may be found in an Integrated Circuit (IC), comprising: a memory circuit comprising a memory cell array and a memory monitoring agent, the memory monitoring agent being configured to indicate a status of the memory cell array; and firmware, configured to receive the indication of the status of the memory cell array from the memory monitoring agent and compare the received indication against a reference level. In embodiments, the memory circuit is in accordance with any such memory circuit as herein disclosed.

In embodiments, the firmware is further configured to store the received indication.

In embodiments, the IC further comprise: a write assist circuit, configured to apply a signal to the memory circuit during a write operation. The firmware is optionally further configured to control the write assist circuit on the basis of the received indication of the status of the memory cell array.

In embodiments, the memory cell array comprises a plurality of bit lines, each bit line being coupled to one or more memory cells of the memory cell array and wherein the memory monitoring agent is configured to indicate a status of the memory cell for each of the plurality of bit lines.

In embodiments, the firmware is configured to control the memory monitoring agent to determine a plurality of statuses of the memory cell array and to indicate the best and/or worst of the determined plurality of statuses to the firmware.

In embodiments, the IC further comprises: a communication interface, configured to provide communication between the firmware and a platform external the IC for communicating the received indication to the platform.

A yet further aspect may be found in a method for operating a memory circuit, comprising: determining a status of the synchronous memory cell array based on a time duration between a transition of a clock signal and a change on a signal derived from at least one of a plurality of bit lines of the synchronous memory cell array due to a signaling on at least one of a plurality of address lines of the synchronous memory cell array.

In embodiments, the method further comprises determining a time duration from the change on the signal from at least one of the plurality of bit lines to a subsequent transition of the clock signal.

In embodiments, the method further comprises: comparing a voltage on one of the bit lines with a reference voltage to provide a comparator output, the signal derived from at least one of the bit lines being the comparator output.

In another further aspect, there may be considered a method for operating a memory circuit, comprising: comparing a voltage on a bit line of a memory cell with a reference voltage to provide a comparator output that is indicative of a status of the memory cell.

In embodiments, the reference voltage is adjustable.

In embodiments, the method further comprises: adjusting the reference voltage and identifying a status of the memory cell based on the comparator output on adjustment of the reference voltage.

In embodiments, the method further comprises: determining a status value of the memory cell corresponding with the reference voltage associated with a change in the comparator output or with a higher value.

In embodiments, the method further comprises: storing a plurality of status values of the memory cell, each stored status value of the memory cell being measured at a respective time.

In embodiments, the memory circuit is a synchronous circuit having a clock signal. Then, the method may further comprise: determining a status indication of the memory cell based on a time duration between a transition of the clock signal and a change on the comparator output.

In embodiments, the memory circuit comprises a memory cell array formed of a plurality of memory cells, each memory cell having a respective bit line configured to provide data input/output to the respective memory cell. Then, the method may further comprise comparing a voltage on one or more of the bit lines with a reference voltage to provide a comparator output that is indicative of a status of one or more of the plurality of memory cells.

In yet another further aspect, there is a method of operating an Integrated Circuit (IC), the method comprising: indicating a status of a memory cell array in the IC; and comparing the indication of the status of the memory cell array against a reference level at firmware in the IC.

In embodiments, the step of indicating a status of a memory cell array in the IC comprises any such method as herein disclosed.

In embodiments, the method further comprises: storing the indication of the status of the memory cell array at the firmware.

In embodiments, the memory cell array comprises a plurality of bit lines, each bit line being coupled to one or more memory cells of the memory cell array. Then, the step of indicating a status of a memory cell array in the IC may comprise indicating a status of the memory cell for each of the plurality of bit lines.

In embodiments, the method further comprises: determining a plurality of statuses of the memory cell array. The step of indicating a status of a memory cell array in the IC may comprise indicating the best and/or worst of the determined plurality of statuses.

In embodiments, the method further comprises: communicating the indication of the status of the memory cell array from the firmware to a platform external the IC.

In embodiments, the method further comprises: reconfiguring the memory cell array based on the step of comparing.

In embodiments, the reconfiguring comprises limiting usage of at least one memory cell of the memory cell array.

In yet another further aspect, there is a method comprising: receiving, from each of a plurality of integrated circuits (ICs) discussed above, the indication of the status of the memory cell array of the respective IC; and analyzing the received indications in a platform external to the ICs, to: detect outlier memory cell array behavior of one or more of the ICs, and/or classify the ICs into different classes according to different memory cell array behaviors of the ICs, and/or reconfigure one or more of the ICs to limit usage of at least one memory cell of the memory cell array of the one or more ICs.

In a related aspect, there is a system comprising (a) at least one hardware processor; and (b) a non-transitory computer-readable storage medium having program code embodied therewith, the program code executable by said at least one hardware processor to perform the latter method.

In a further related aspect, there is a computer program product comprising a non-transitory computer-readable storage medium having program code embodied therewith, the program code executable by at least one hardware processor to perform the latter method.

In addition to the exemplary aspects and embodiments described above, further aspects and embodiments will become apparent by reference to the figures and by study of the following detailed description. Moreover, the various features and embodiments of the invention described above are specifically contemplated to be used alone as well as in various combinations.

BRIEF DESCRIPTION OF THE FIGURES

Exemplary embodiments are illustrated in referenced figures. Dimensions of components and features shown in the figures are generally chosen for convenience and clarity of presentation and are not necessarily shown to scale. The figures are listed below.

FIG. 8B shows a waveform timing diagram for signals shown in the schematic circuit diagram of FIG. 8A.

DETAILED DESCRIPTION

The present disclosure provides circuits, methods, and systems for measuring and/or detecting degradation of memory cells in a memory circuit, that may evolve into failure of write and/or read operations. This may allow such degradation to be detected early enough to allow protection of the memory circuit and optionally to take mitigating action during the design, manufacture, and/or normal (field) usage of the memory circuit.

Embodiments according to the disclosure will discussed with specific reference to Static Random Access Memory (SRAM). However, embodiments in accordance with the disclosure may also be applied to other types of electronic (digital) memories, as will be further discussed below.

Figure 1:
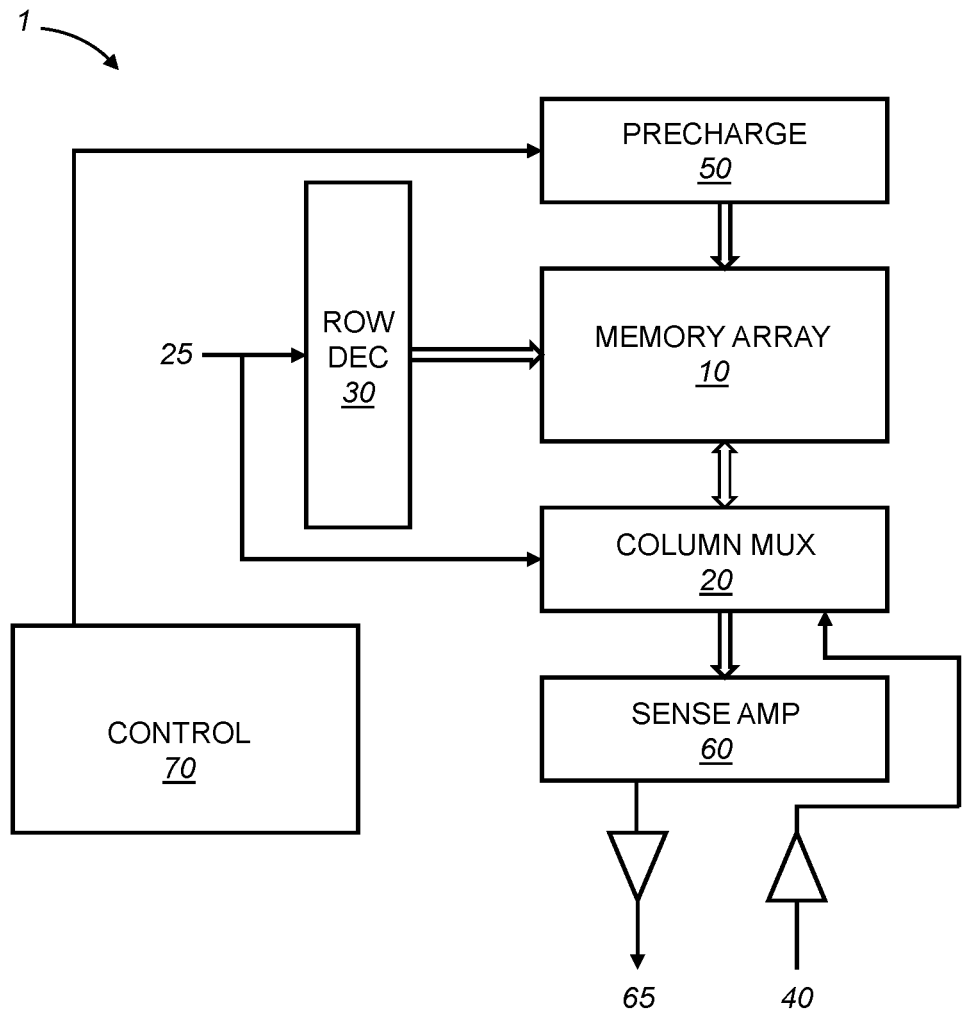
FIG. 1 shows a schematic block diagram of an existing Static Random Access Memory (SRAM) circuit.

With reference to FIG. 1, there is shown a schematic block diagram of an existing SRAM circuit 1. The SRAM circuit 1 comprises: a memory array 10; a column multiplexor 20; a row decoder 30; a precharge circuit 50; a sensing amplifier 60; and a controller 70. The memory array 10 comprises an array of SRAM cells, each SRAM cell storing one bit of data. The SRAM cells of the memory array 10 are arranged in two dimensions that are addressed by identification of a respective row and column. An addressing signal 25 is provided to the column multiplexor 20 and the row decoder 30, which activate one or more SRAM cells in the memory array 10. The precharge circuit 50 is controlled by controller 70 depending on whether a read or write operation is being selected. If a read operation is selected, the data bit stored in the addressed SRAM cell is indicated on a bit line (not shown) and this data is passed to sensing amplifier 60, which provides the data bit as an output 65. The SRAM circuit 1 is a synchronous circuit and the read and write processes are governed by a clock signal 40.

It has been recognized that degradation or defects in SRAM circuits, such as the illustrative SRAM circuit 1, may lead to failure of read and/or write operations. Typically, this is only discovered when the operation actually fails. At this stage, it is too late to prevent damage to the SRAM circuit 1 and/or the data stored in the SRAM circuit 1. The present disclosure provides circuits that are configured to detect degradation of an SRAM cell that may evolve into failure of write and/or read operations. This may allow such degradation to be detected early enough to allow protection of the SRAM circuit and optionally to take mitigating action during the design, manufacture, and/or normal (field) usage of the SRAM circuit. The circuit may have a number of parts (or, in another sense, be configured as multiple circuits), for example for detecting degradation in respect of read and write operations separately. The circuit may monitor degradation over time, for example allow benchmarking at an early stage in the SRAM lifetime, for comparison purposes during aging. The circuit (or circuits) are designed and configured not to interfere with the operation of the memory array of the SRAM circuit.

Figure 2:
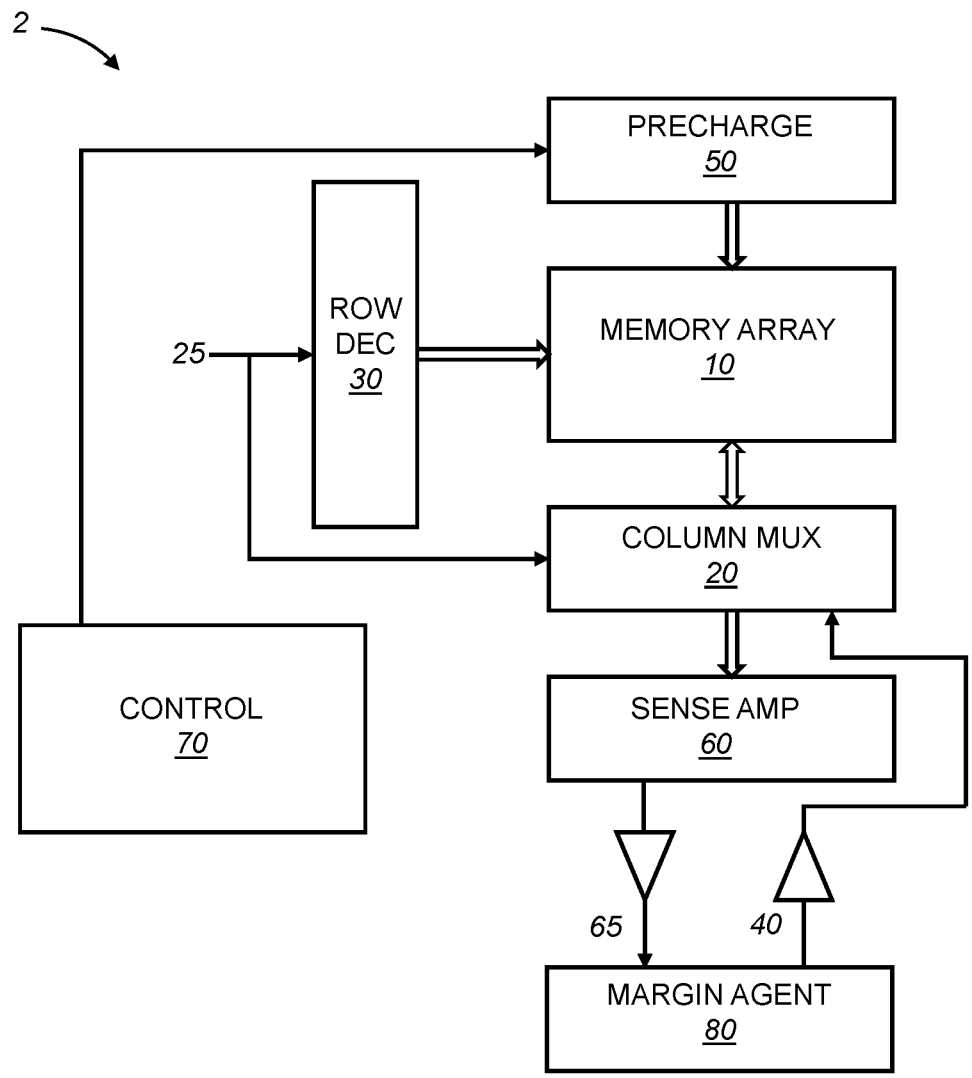
FIG. 2 shows a schematic block diagram of an SRAM circuit in line with a first embodiment in accordance with the disclosure.

Reference is made to FIG. 2, which shows a schematic block diagram of an SRAM circuit 2, in line with a first embodiment in accordance with the disclosure. Where the same features are depicted as shown in FIG. 1, the same reference numerals are used. The SRAM circuit 2 is configured for monitoring of degradation of the SRAM memory array 10 and associated circuitry, particularly in respect of read operations.

In particular, a timing delay between a readout signal appearing on the output line 65 and a transition (particularly a rising edge transition) on clock signal 40 may provide a measure of the degradation. This timing delay may be termed a 'timing delay margin.' A margin agent 80 is therefore provided to determine this timing delay, specifically at the output of the SRAM circuit 2. This may be a first type of degradation monitoring circuit in accordance with that discussed above. The margin agent 80 may determine the timing delay by applying a delay circuit to one of the received signal paths and comparing the delayed signal path with the other signal path. By setting the delay circuit appropriately, the margin can be measured. Further details on margin measurements and margin agents may be found in co-pending, co-assigned PCT International Publication No. WO 2019/097516, the contents of which are incorporated herein by reference in their entirety. Measuring the margin (using the margin agent 80) over time, in particular showing a reduction in margin, may show degradation of the SRAM circuit 2.

In general terms, there may be considered a memory circuit, comprising: a synchronous memory cell array, configured to receive a clock signal and having address lines and bit lines; and a margin agent, configured to receive a signal derived from at least one of the bit lines and to determine a status (or performance) indication of the synchronous memory cell array based on a time duration between a transition of the clock signal and a change on the received signal from at least one of the bit lines due to a signaling on at least one of the address lines. The signal derived from at least one of the bit lines may be representative of a read operation and/or a write operation. This may be applied to SRAM or other types of RAM or ROM and/or other memory devices, as will be discussed below.

In embodiments, the margin agent is configured to determine a time duration from the change on the received signal to a subsequent transition of the clock signal (optionally, a rising edge). In some embodiments, the memory circuit further comprises: an output stage (such as a buffer or amplification stage), coupled to the bit lines of the synchronous memory cell array, the margin agent being configured to receive the signal derived from at least one of the bit lines from the output stage. For evaluating a read operation, the signal derived from at least one of the bit lines may be an output signal from the bit line during a read operation. The output stage may comprise a sensing amplifier, in particular configured to amplify a differential signal received from the bit lines of the synchronous memory cell array.

A method corresponding with this aspect may also be considered, for example a method for operating or manufacturing a memory circuit. A method for operating a memory circuit comprises: determining a status (or performance) of the synchronous memory cell array based on a time duration between a transition of a clock signal and a change on a signal derived from at least one of a plurality of bit lines of the synchronous memory cell array due to a signaling on at least one of a plurality of address lines of the synchronous memory cell array. Optionally, the method further comprises determining a time duration from the change on the signal from at least one of the plurality of bit lines to a subsequent transition of the clock signal. As noted above, such methods may be applied to SRAM or other types of RAM or ROM, as will be discuss below.

Figure 3:
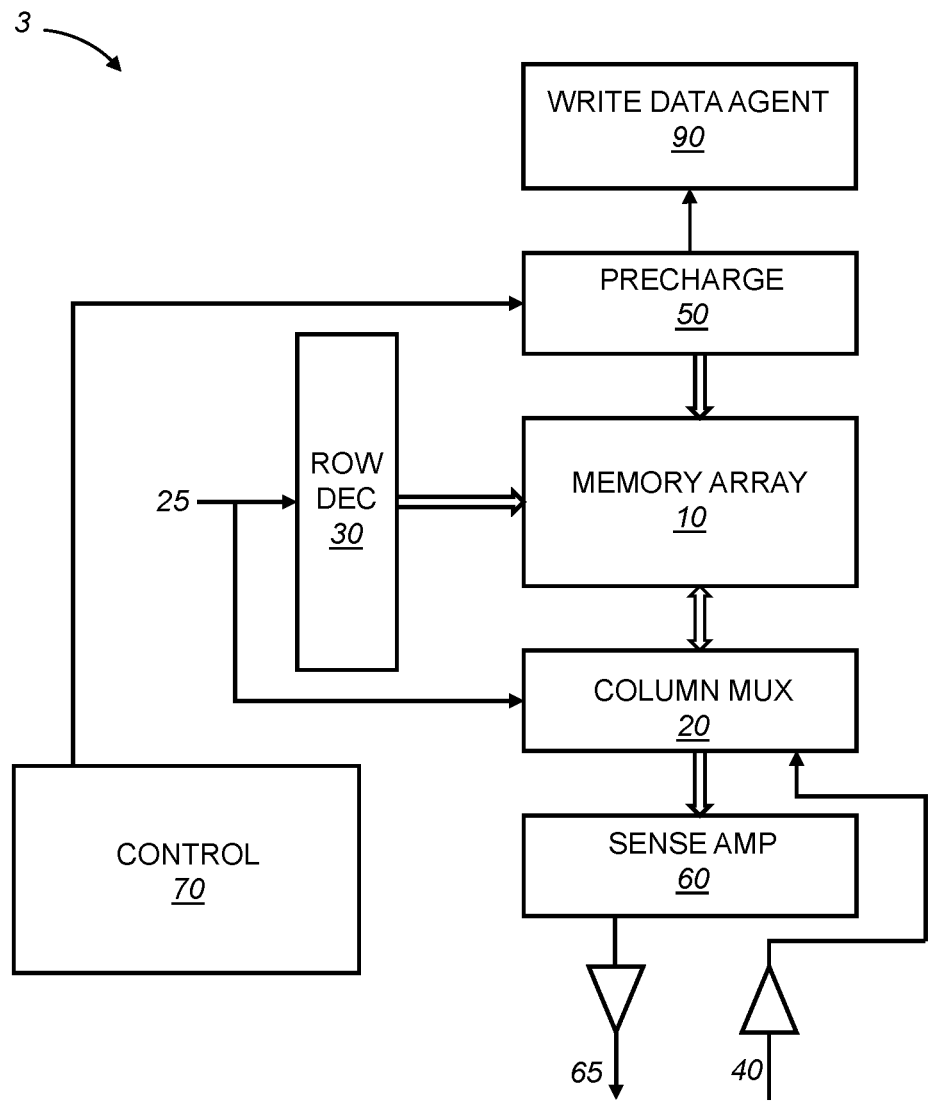
FIG. 3 shows a schematic block diagram of an SRAM circuit in line with a second embodiment in accordance with the disclosure.

Reference is made to FIG. 3, which shows a schematic block diagram of an SRAM circuit 3 in line with a second embodiment in accordance with the disclosure. Where the same features are depicted as shown in FIG. 1, the same reference numerals are used. The SRAM circuit 3 is configured for monitoring of degradation of the SRAM memory array 10 and associated circuitry, particularly in respect of write operations. The SRAM circuit 3 additionally includes a write data agent 90. This may be a second type of degradation monitoring circuit in accordance with that discussed above. The write data agent 90 is provided at, adjacent or near the precharge circuit 50 (at the same pitch as the precharge device). As this is outside the memory array 10, it may be more efficient in terms of space and power and may improve performance of the write data agent 90. It should be noted that the combination of the embodiments shown in FIG. 2 and FIG. 3 is possible, such that both margin agent 80 and write data agent 90 (both types of degradation monitoring circuit) may be provided within an SRAM circuit.

The purpose of the write data agent 90 is to (continuously) monitor the write-data operation of the SRAM memory array 10. The write data agent 90 is intended to provide an alert on write-data degradation before write-data error occurs. The memory array 10 may be especially sensitive to defects and/or degradation. This may provide significant value to the user in allowing alert before failure and/or providing a write-assist margin characterization (as will be discussed further below). The write data agent 90 may therefore indicate a status of the write data operation of the memory array 10 and by monitoring this status over time, degradation and/or defects may be detected. Advantageous designs for the write data agent 90 will be discussed below.

Figure 4:
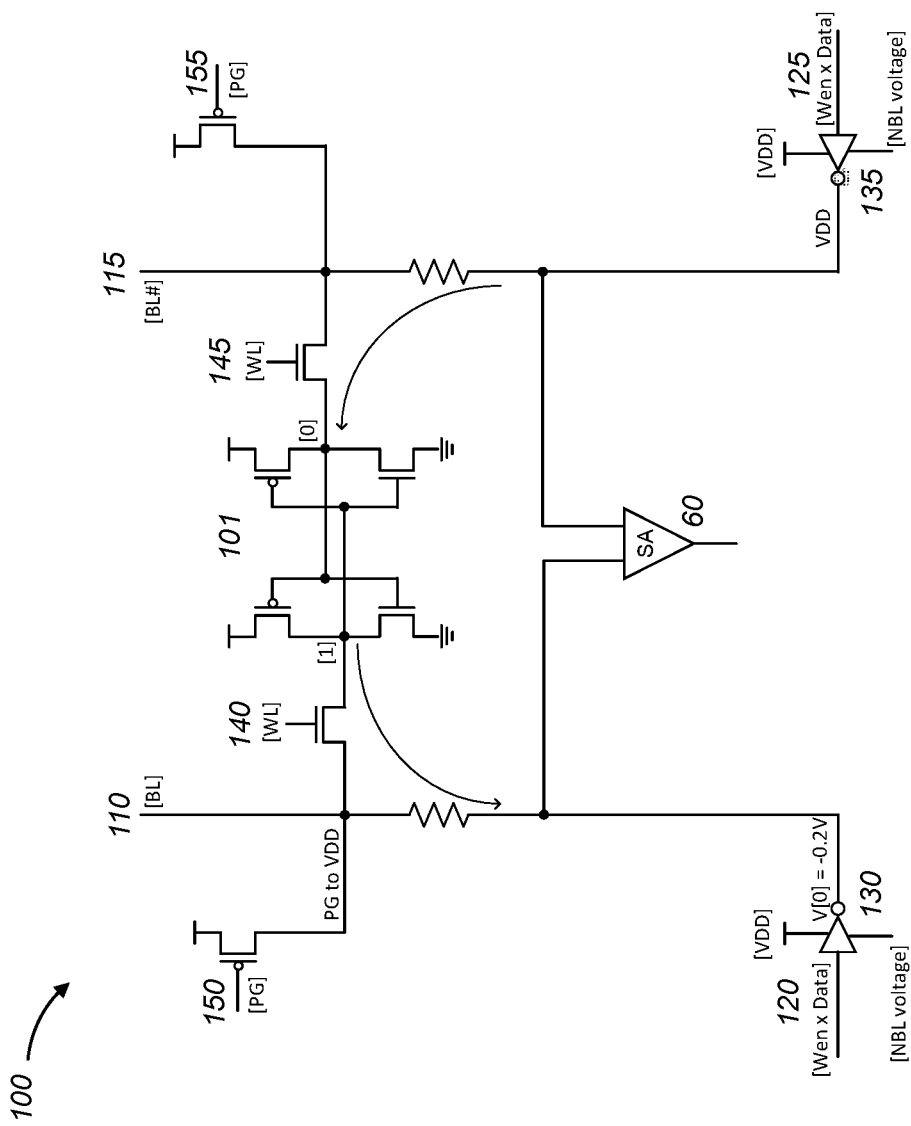
FIG. 4 shows a schematic circuit diagram of an existing SRAM array unit.

Reference is now made to FIG. 4, which shows a schematic circuit diagram of an existing SRAM array unit 100. The SRAM array unit 100 comprises: an SRAM memory cell 101; a bit line 110; an inverse bit line 115; a sensing amplifier 60; a write data input 120; a first write inverting amplifier 130; an inverted write data input 125; a second write inverting amplifier 135; a first word line enable switch 140; a second word line enable switch 145; a first pass gate switch 150; and a second pass gate switch 155. The configuration of the SRAM memory cell 101 with the first word line enable switch 140 and the second word line enable switch 145 provides a standard 6-transistor configuration for an SRAM memory cell in a memory array.

Figure 5:
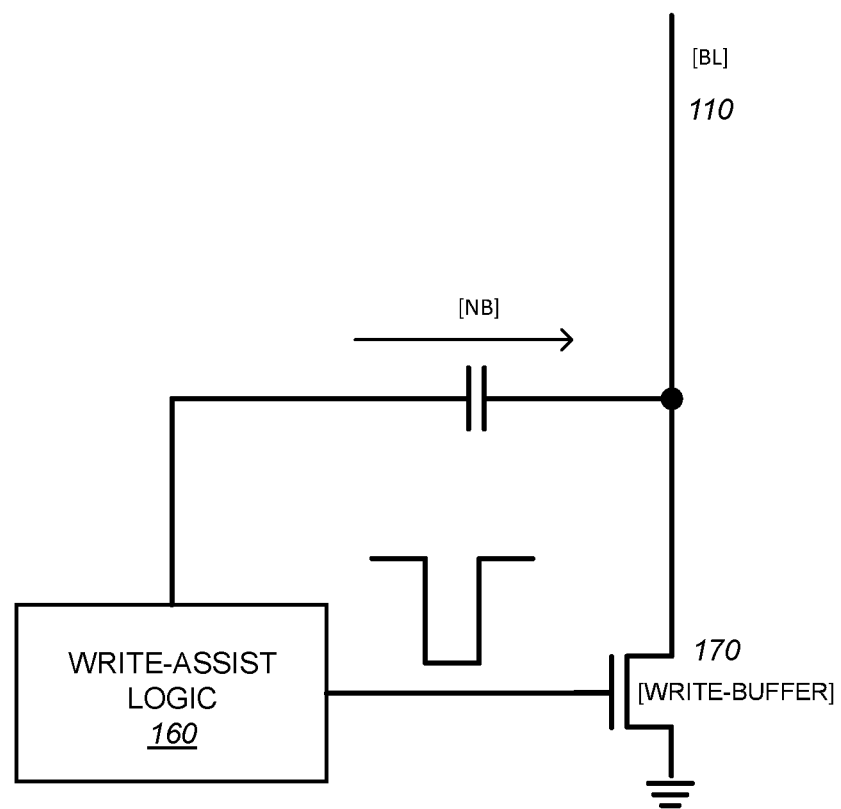
FIG. 5 shows a schematic block diagram of a write assist logic agent in accordance with the disclosure.

The write data input 120 comprises the combination (AND) of a write enable signal and a write data signal. The inverted write data input 125 is the inverse of the write data input 120. The first word line enable switch 140 and the second word line enable switch 145 are controlled by the same word line signal. The first pass gate switch 150 and the second pass gate switch 155 are controlled by the same pass gate signal. When the first word line enable switch 140 and the second word line enable switch 145 are enabled and the write data input 120 (and the inverted write data input 125) are at a logical low level, a read operation is performed and the bit line 110 and inverse bit line 115 indicate the data bit stored in the SRAM memory cell 101. The bit line 110 and the inverse bit line 115 are provided to the sensing amplifier 60, which provides a data bit output for the SRAM array unit 100. Reference is made to FIG. 5, which shows a schematic block diagram of a write assist logic in accordance with the disclosure. A write-assist logic 160 is used to control a write buffer switch 170 on the bit line 110. This may be used to control a pulsed negative voltage on the bit line 110. The write data agent 90 can be used to optimize the write assist logic 160, by setting or increasing the write-assist pulse width (that is, the width of the pulsed negative voltage on the bit line 110) based on degradation detection. For example, the system can initialize with no write-assist pulse and activate the write-assist pulse based on degradation identified by the write data agent 90.

Figure 6A:
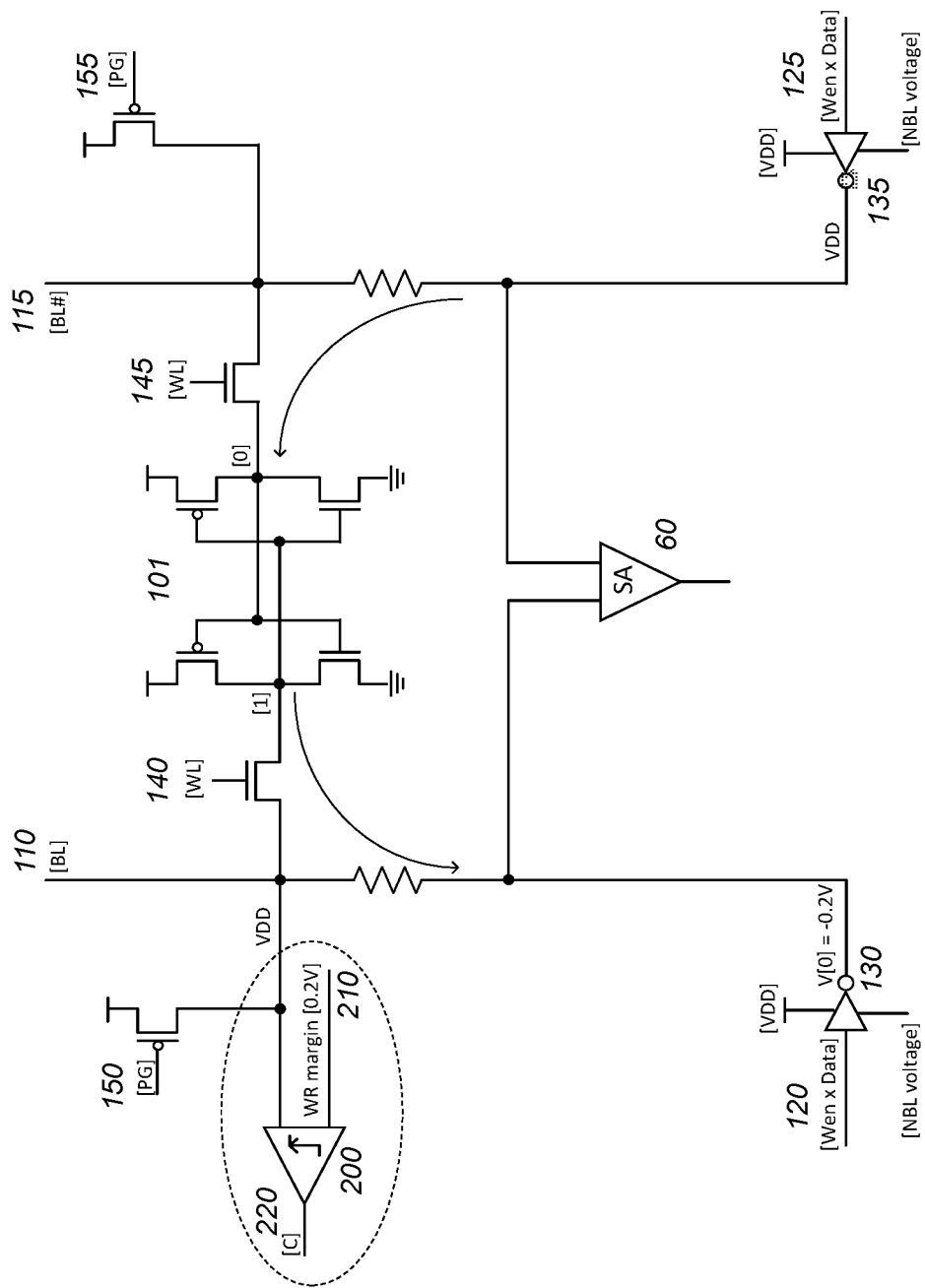
FIG. 6A shows a schematic circuit diagram of an SRAM array unit with a first write detection indicator in line with an embodiment in accordance with the disclosure.

Further discussion and embodiments of the write data logic 90, as discussed with reference to FIG. 3 above will now be presented. In this respect, reference is made to FIG. 6A, which shows a schematic circuit diagram of an SRAM array unit with a write detection indicator, as at least part of a write data agent 90. The SRAM array unit shown in FIG. 6A includes all of the features of the SRAM array unit 100 shown in FIG. 4 and the same features are labelled with identical reference numerals. The additional components making up the write detection indicator comprise: a comparator 200 providing an output 220; and a margin reference level 210, which is provided as one of the inputs to the comparator 200. The other input to the comparator 200 is provided by the bit line 110 (where it is coupled to the first word line enable switch 140 and the first pass gate switch 150). The comparator 200 is optionally an inverter-based comparator with offset cancellation and a possible embodiment of this will be discussed further below. The comparator output 220 will remain low if the voltage on the bit line 110 is higher than the voltage of the margin reference level 210.

As write operations are performed on the SRAM memory cell 101, the comparator 200 is affected by the same voltage felt by the bit line 110 that is driven to zero voltage (or even to less than zero). The comparator 200 then compares the voltage of the bit line 110 with the margin reference level 210, which acts as a reference voltage (typically higher than zero, for example 0.2V). By reading the comparator output 220, it can be determined if the write operation has succeeded (because the bit line voltage 110 is discharged to lower than the reference voltage) or failed (bit line voltage was higher than reference voltage).

Performing occasional small changes to the margin reference level 210, can allow pinpointing of the exact voltage at which write operations fail. In other words, the determination of such a threshold for the margin reference level 210 may indicate a performance of the write operation. This threshold of the margin reference level 210 may change (typically worsen, such that the margin gets lower) over time. By tracking it, predictions as to when the SRAM memory cell 101 will completely fail can be made. Additionally or alternatively, the margin reference level 210 may be set for an individual IC (in which the SRAM is provided) or in accordance with a certain profile of the IC or in accordance with the IC functionality.

Figure 6B:
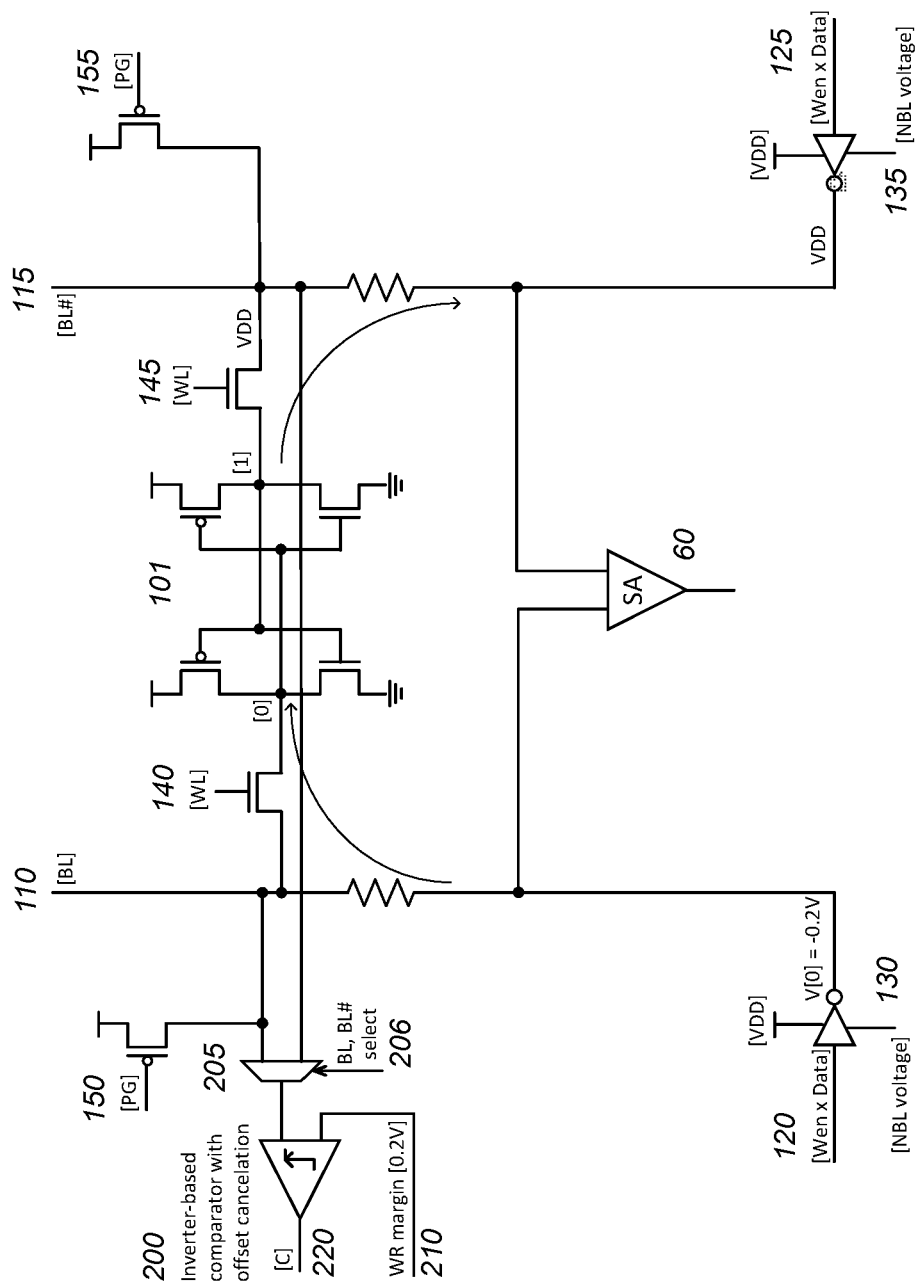
FIG. 6B shows a schematic circuit diagram of an SRAM array unit with a second write detection indicator in line with an embodiment in accordance with the disclosure.

Reference is made to FIG. 6B, which shows a schematic circuit diagram of an SRAM array unit with a second write detection indicator, as at least part of a write data agent 90, especially for write-degradation monitoring of the inverse bit line 115. The SRAM array unit shown in FIG. 6B includes all of the features shown in FIG. 6A and the same features are labelled with identical reference numerals. Also provided is a multiplexer 205, having a first input connected to the bit line 110 and a second input connected to the inverse bit line 115. A bit line selection signal 206 is used to select whether the output of the multiplexer 205 (which is provided as an input to the comparator 200) is the bit line 110 or the inverse bit line 115. The bit line selection signal 206 is advantageously based on the data polarity: if the data is a logical high level, then the cell is writing a logical low level to the inverse bit line 115 and the multiplexer 205 should select the inverse bit line 115. Conversely, if the data is a logical low level, then the cell is writing a logical low level to the bit line 110 and the multiplexer 205 should select the bit line 110.

Figure 7A:
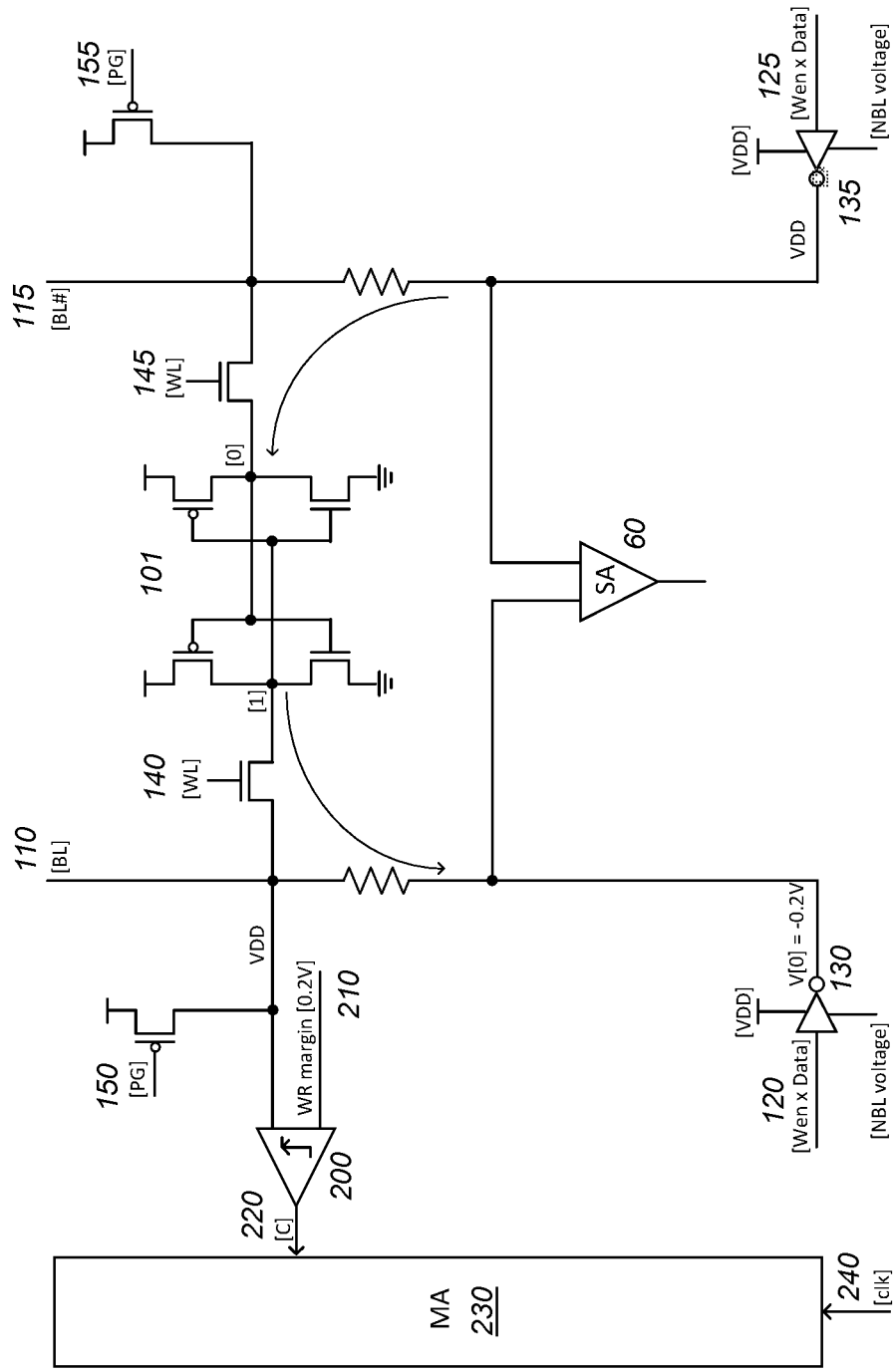
FIG. 7A shows a schematic circuit diagram of an SRAM array unit with a first write performance indicator in line with an embodiment in accordance with the disclosure.

This approach can be taken further, as in a synchronous SRAM circuit, the timing of the comparator output 220 (indicative of a write operation success) may also be used as a performance indication. Reference is made to FIG. 7A, which shows a schematic circuit diagram of an SRAM array unit with a write performance indicator. This comprises the features shown in FIG. 6A and these are labelled with the same reference numerals. In this approach, the comparator output 220 is provided as an input to a margin agent 230. A second input to the margin agent 230 is provided by the clock signal 240.

The margin agent 230 may therefore determine a timing delay between a write operation success signal (from the comparator output 220) and a transition (particularly a rising edge transition) on clock signal 240. This may provide a measure of degradation in the write operation. This timing delay may be termed a timing delay margin. The margin agent 230 may determine the timing delay by applying a delay circuit to one of the received signal paths and comparing the delayed signal path with the other signal path or other approach, for example as discussed above. The margin may vary over the lifetime of the SRAM memory cell 101 (typically by reduction) and this may be captured using the approach described herein.

Figure 7B:
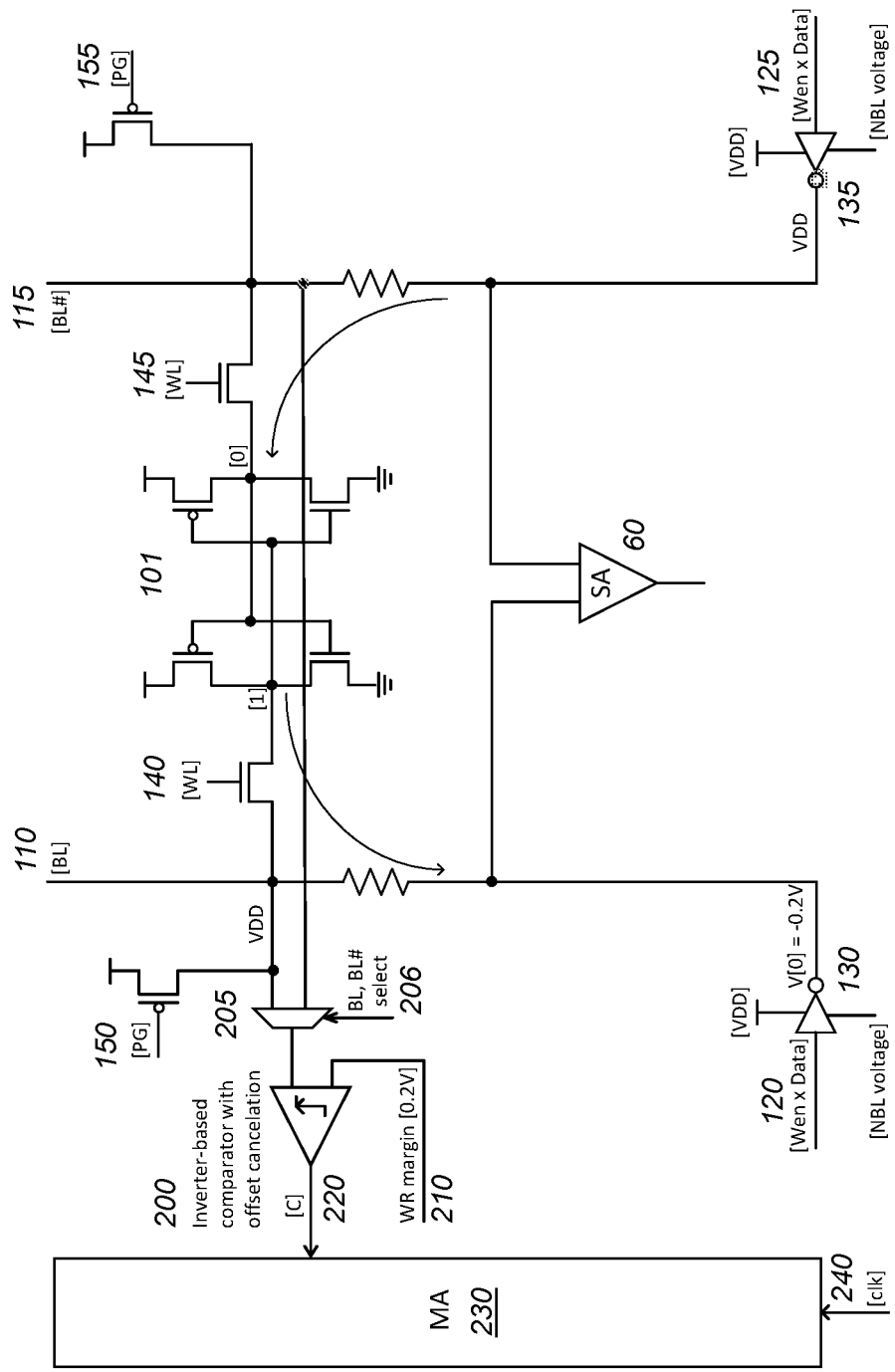
FIG. 7B shows a schematic circuit diagram of an SRAM array unit with a second write performance indicator in line with an embodiment in accordance with the disclosure.

Reference is made to FIG. 7B, which shows a schematic circuit diagram of an SRAM array unit with a second write performance indicator. This comprises the features shown in FIG. 6B and these are labelled with the same reference numerals. The additional features of FIG. 7A, providing the comparator output 220 as an input to a margin agent 230 and a second input to the margin agent 230 provided by the clock signal 240, are also indicated.

Figure 7C:
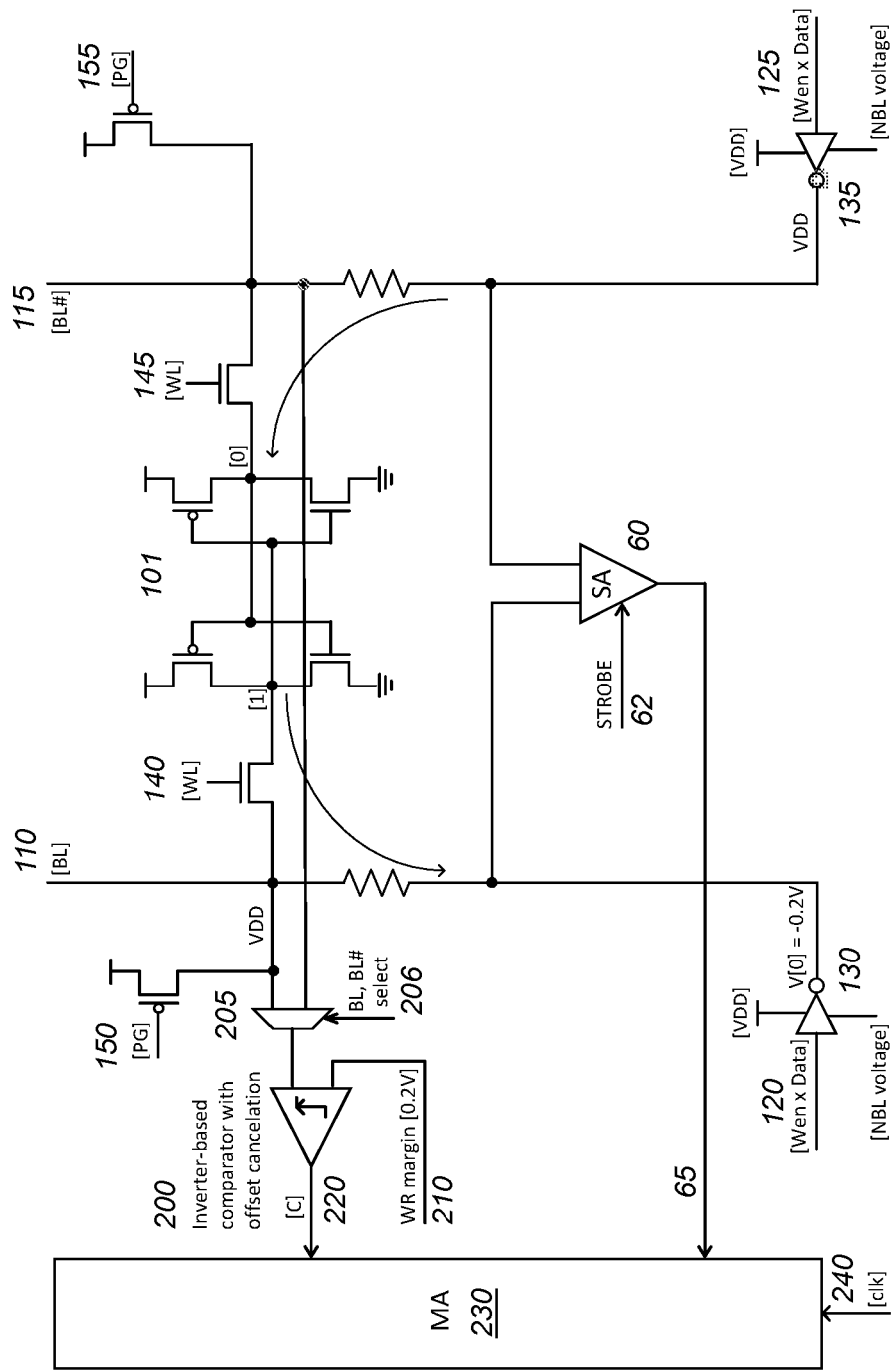
FIG. 7C shows a schematic circuit diagram of an SRAM array unit with a third write performance indicator in line with an embodiment in accordance with the disclosure.

Reference is also made to FIG. 7C, which shows a schematic circuit diagram of an SRAM array unit with a read/write performance indicator. This comprises the features shown in FIG. 7B and these are labelled with the same reference numerals. In addition, there is shown a Sensing Amplifier Strobe Signal 62. This is a signal that causes activation or deactivation of the Sensing Amplifier 60. During a read operation, the Sensing Amplifier Strobe Signal 62 is configured to cause the Sensing Amplifier 60 to activate at a predetermined time interval from the read operation being selected. The predetermined time interval allows a voltage gap to develop between the bit line 110 and the inverse bit line 115.

To measure or monitor read degradation, the output 65 of the Sensing amplifier 60 is measured after the read operation is selected but before the activation of the Sensing Amplifier 60 by the Sensing Amplifier Strobe Signal 62.

In terms of the general sense discussed above, for example, it may be considered that the memory circuit (for example, SRAM circuit) further comprises: a comparator, configured to compare a voltage on one of the bit lines with a reference voltage and provide a comparator output, the margin agent being configured to receive the comparator output as the signal derived from at least one of the bit lines. This may allow the read and/or write margin to be determined based on the comparator output. The margin agent can thereby track the timing of the comparator output during a read operation (comparing the discharged signal on the bit line or inverse bit line to a read-margin-level) and/or during a write operation (comparing the successful write indicated by the bit line or inverse bit line against a write-margin-level).

In another general sense, there may be considered a memory circuit, comprising: a memory cell, having a bit line configured to provide data input/output to the memory cell; and a comparator, configured to compare a voltage on the bit line with a reference voltage and provide a comparator output that is indicative of a status of the memory cell. Optionally, memory cell is a RAM cell and further optionally, the RAM cell is an SRAM cell.

In embodiments, the reference voltage is adjustable. For example, the memory circuit may further comprise: a controller, configured to adjust the reference voltage and identify a status of the memory cell based on the comparator output on adjustment of the reference voltage. Optionally, the controller is configured to determine a status value of the memory cell corresponding with the reference voltage associated with a change in the comparator output or with a higher value (for instance, a threshold value). In embodiments, the controller is configured to store a plurality of status values of the memory cell, each stored status value is respective of the reference voltage being measured at a respective time.

In embodiments, the memory cell has a standard bit line and an inverse bit line. In such cases, a signal on the inverse bit line is typically the logical inverse of a signal on the standard bit line. Then, the memory circuit may further comprise a multiplexer, configured to selectively provide the signal on the standard bit line and the signal on the inverse bit line to the comparator (as the voltage on the bit line). In particular, the selection may be based on the signal on the standard bit line and/or the signal on the inverse bit line. For example, if the signal on the standard bit line is a logical low level, the multiplexer may be configured to provide the signal on the standard bit line to the comparator and if the signal on the inverse bit line is a logical low level, the multiplexer may be configured to provide the signal on the inverse bit line to the comparator.

In certain embodiments, the memory circuit is a synchronous circuit having a clock signal. Then, the memory circuit may further comprise: a margin agent, configured to receive the comparator output and to determine a status (or performance) indication of the memory cell based on a time duration between a transition of the clock signal and a change on the comparator output.

In embodiments, an output stage of the memory circuit comprises a sensing amplifier, configured to amplify a signal received from the bit lines of the synchronous memory cell array. For example, the signal received from the bit lines of the synchronous memory cell array may comprise a bit line signal and an inverse bit line signal (the bit line signal and the inverse bit line signal being configured as the logical inverse of one another) and in this case, the sensing amplifier may be configured to amplify a differential signal. The sensing amplifier may be further configured to receive a strobe signal that controls activation of the sensing amplifier at a predetermined time interval after selection of a read operation for the synchronous memory cell array. Then, a margin agent in accordance with the disclosure may be configured to receive the signal derived from at least one of the bit lines from the sensing amplifier at a time that is after selection of the read operation by less than the predetermined time interval.

In embodiments according to any aspect or general sense discussed herein, the memory (optionally RAM) circuit comprises a memory cell array formed of a plurality of memory cells. Each memory cell has a respective bit line configured to provide data input/output to the respective memory cell. Then, the comparator may be configured to compare a voltage on one or more of the bit lines with a reference voltage and provide a comparator output that is indicative of a status (for example, a write operation success status) of one or more of the plurality of memory cells. In some embodiments, the memory circuit comprises a plurality of comparators. Each comparator may be configured to compare a voltage on a respective one or more of the bit lines with a respective reference voltage and provide a respective comparator output that is indicative of a status of a respective one or more of the plurality of memory cells. The comparator or each of the comparators is advantageously positioned outside the memory cell array. For example, the memory circuit may comprise a precharge circuit coupled to the bit lines of the plurality of memory cells. Then, the comparator or each of the comparators (and/or the margin agent or each of the margin agents) may be positioned at or adjacent the precharge circuit.

In certain embodiments, the memory circuit further comprises: addressing circuitry configured to select a memory cell for a read or (in the case of RAM) a write operation.

According to any aspect or embodiment as herein disclosed, there may be provided an Integrated Circuit (IC), comprising the memory circuit.

According to method aspects disclosed herein, a further step of comparing a voltage on one of the bit lines with a reference voltage to provide a comparator output may be considered. Here, the signal derived from at least one of the bit lines is the comparator output.

In line with another method aspect (which may be combined with any other aspect disclosed herein), there may be considered a method for operating a memory circuit comprising: comparing a voltage on a bit line of a memory cell with a reference voltage to provide a comparator output that is indicative of a status of the memory cell. Here, the reference voltage is optionally adjustable. In embodiments, the method may further comprise: adjusting the reference voltage and identifying a status of the memory cell based on the comparator output on adjustment of the reference voltage. Then, the method may further comprise: determining a status value of the memory cell corresponding with the reference voltage associated with a change in the comparator output or with a higher value. In embodiments, the method further comprise: storing a plurality of status values of the reference voltage, each stored status value of the reference voltage being measured at a respective time.

In accordance with any aspect, the memory circuit may be a synchronous circuit having a clock signal. In such embodiments, the methods may further comprise: determining a status (or performance) indication of the memory cell based on a time duration between a transition of the clock signal and a change on the comparator output.

In some embodiments, the memory (optionally, RAM) circuit comprises a memory cell array formed of a plurality of memory cells, each memory cell having a respective bit line configured to provide data input/output to the respective memory cell. Then, the method may further comprise comparing a voltage on one or more of the bit lines with a reference voltage to provide a comparator output that is indicative of a status of one or more of the plurality of SRAM cells.

An advantageous inverter-based comparator with offset cancellation for use in the embodiments of FIGS. 6A-6B and FIGS. 7A-7C is now described. In this regard, reference is made to FIG. 8A, which shows a schematic circuit diagram of a comparator circuit 300. The comparator circuit 300 comprises: a first input 310 (also labelled $V_{REF}$); a first switch 315 gating the first input 310; a second input 320 (also labelled Vin); a second switch 325 gating the second input 320; an inverting amplifier 330; a third switch 335 provided in a feedback path between an input of the inverting amplifier 330 and an output of the inverting amplifier 330; a capacitor 340; and an output matched-inverter 350 providing an output 360. The capacitor 340 is coupled between the first node (receiving the gated first input from the first switch 315 and the gated second input from the second switch 325) and a second node at the input to the inverting amplifier 330. The voltage across the capacitor 340 is labelled $V_C$. In the context of the embodiments of FIGS. 6A-6B and FIGS. 7A-7C, the margin reference level 210 of those figures may be provided to the first input 310 ($V_{REF}$) of FIG. 8A, and the bit line 110 of those figures may be provided to the second input 320 (Vin) of FIG. 8A. The output matched-inverter 350 has a threshold voltage that is equal the threshold voltage of the inverting amplifier 330.

Figure 8A:
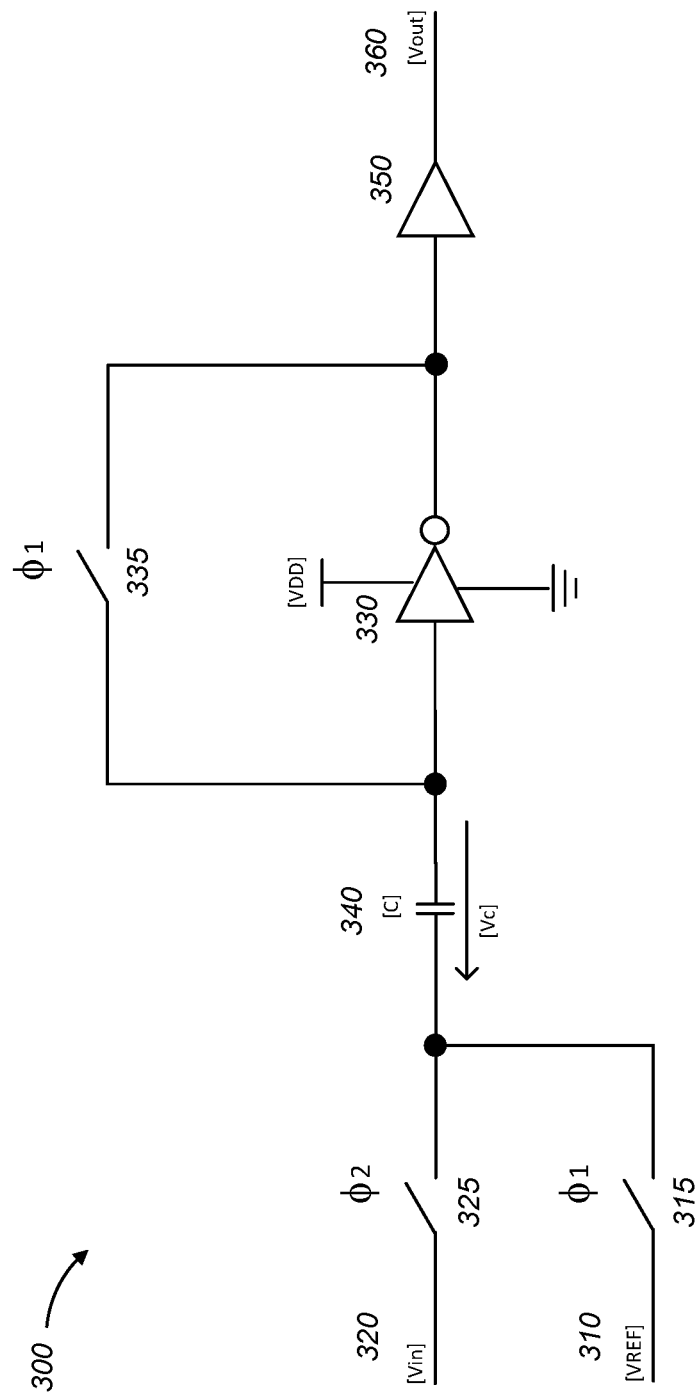
FIG. 8A shows a schematic circuit diagram of a comparator circuit for use in embodiments in accordance with the disclosure.

The first switch 315 is controlled by a first control signal $\Phi 1$. The third switch 335 is also controlled by the first control signal $\Phi 1$. The second switch 325 is controlled by a second control signal $\Phi 2$. Reference is then made to FIG. 8B, which shows a waveform timing diagram for signals shown in the schematic circuit diagram of FIG. 8A.

The comparator circuit 300 operate in two phases. The first phase is a calibration phase (offset cancellation), in which the inverting amplifier 330 input and output are shorted and the capacitor 340 is charged. In the second (evaluation) phase, the inverting amplifier 330 acts like an amplifier or a comparator (as the input and output are disconnected).

In particular, it can be seen that, in the first phase, the first control signal $\Phi 1$ is configured to activate the first switch 315 and the third switch 335 such that ($V_{out}=V_{in}=V_{trip}$). Then, the voltage $V_C$ across the capacitor 340 is charged to $V_{trip}-V_{REF}$. The voltage $V_{trip}$ represents an inverter trip-point, that is the output voltage (or the input voltage) when the output of the inverting amplifier 330 and the input of the inverting amplifier 330 are shorted.

In the second phase, the first control signal $\Phi 1$ is configured to deactivate the first switch 315 and the third switch 335. The second control signal $\Phi 2$ is configured to active the second switch 325. This causes the voltage $V_C$ across the capacitor 340 to increase to $V_{trip}-(V_{REF}-V_{in})$ and for the output of the inverting amplifier 330 ($V_{out}$) to switch to $V_{ss}$. As a result, if Vin is greater than $V_{REF}$, the output will go low, and if $V_{in}$ is less than $V_{REF}$, the output will go high. By using the offset cancellation technique, the comparator circuit 300 may be reliable and effectively cancel noise and/or VDD-based effects.

In general senses as discussed above, the memory (typically RAM) circuit may comprise one or more comparators, wherein each comparator comprises an inverter-based amplifier.

According to these aspects or independently from other aspects discussed herein, an inverter-based amplifier may comprise: an inverting amplifier (or a small-size comparator), having an input and an output; a capacitor coupled at a first end to the input of the inverting amplifier; a first signal input port coupled to a second end of the capacitor via a first switch; a second signal input port coupled to the second end of the capacitor via a second switch; a feedback connection, coupling the output of the inverting amplifier to the input of the inverting amplifier via a third switch; and a controller, configured to activate the first and third switches at the same time and to activate the second switch when the first and third switches are deactivated. This may allow the capacitor to be charged to a signal based on a threshold voltage reduced by a voltage at the first signal input port and then the output may be provided indicative of the difference between a voltage at the second signal input port and the voltage at the first signal input port (and the threshold voltage). This control operation may be repeated, such that the first and third switches are activated with the second switch deactivated and then the first and third switches are deactivated with the second switch activated in alternating fashion.

In embodiments, the inverting amplifier is a first inverting amplifier having a threshold voltage. The memory circuit may then further comprise a second inverting amplifier, configured to receive the output of the first inverting amplifier as an input. A threshold voltage of the second inverting amplifier is advantageously equal (or approximately or substantially equal) to the threshold voltage of the first inverting amplifier.

As indicated above, the memory circuit, for example SRAM, may be implemented on an IC. Firmware on the IC (for example as part of the controller 70), or any other suitably-configured circuit and/or software on the IC (all referred to herein as "firmware" for reasons of simplicity) may be used to determine measurements from one or more of the read operation margin agent, write data indicator and write operation margin agent. The firmware may control processing of received measurements. The firmware may store outputs. The firmware may receive, process and/or issue the status (or performance) indication(s). The firmware may provide any one of the measurements (in raw or processed form), outputs, and indications (collectively, "data") to an analytical platform external the IC, using a communications interface of the IC. Data analysis from a large number of such ICs may be advantageously performed at the platform.

The analytical platform may be a computerized system including one or more hardware processor(s) (e.g., CPUs), a random-access memory (RAM), one or more non-transitory computer-readable storage device(s), and a network interface controller (NIC). The storage device(s) may have stored thereon program instructions and/or components configured to operate the hardware processor(s). The program instructions may include one or more software modules, such as a module that analyzes the data received from sources such as ICs operating in the field, pre-silicon design and simulation software, and/or post-silicon testing devices.

The software components may include an operating system having various software components and/or drivers for controlling and managing general system tasks (e.g., memory management, storage device control, power management, network communication, etc.), and facilitating communication between various hardware and software components.

The analytical platform may operate by loading instructions of the data analysis module into the RAM as they are being executed by the processor(s). The instructions of the data analysis module may cause the analytical platform to receive, such as through its network interface controller (e.g., through the Internet) data gathered from one or more of the above-mentioned sources, process it, and output statistical analysis of the data. The statistical analysis may be indicative, for example, of a status and/or performance distribution of the ICs, and may include detection of outliers with respect to memory cell array behavior (status and/or performance-wise) of the ICs. The ICs may be classified into different classes according to different such behaviors. Based on the analysis performed at the platform, one or more of the ICs may be reconfigured to limit usage of one or more of their memory cells, as discussed further below; in this respect, the platform may transmit a message to each IC to be reconfigured, through the NIC of the platform and the communication interfaces of these ICs. The message may include an instruction on how to reconfigure the pertinent memory cell(s), and the firmware of each respective IC may be configured to execute the instruction and perform or otherwise effect the configuration. The instruction may be individual to each IC, respective of specific status/performance of that IC. Alternatively, a same instruction may be transmitted to multiple ICs whose statistical analysis classified as closely related.

The analytical platform as described herein is only an exemplary embodiment of the present invention, and in practice may be implemented in hardware only, software only, or a combination of both hardware and software. The analytical platform may have more or fewer components and modules than shown, may combine two or more of the components, or may have a different configuration or arrangement of the components. The analytical platform may include any additional component enabling it to function as an operable computer system, such as a motherboard, data busses, power supply, a display, an input device (e.g., keyboard, pointing device, touch-sensitive display), etc. Moreover, components of the analytical platform may be co-located or distributed, or the analytical platform could run as one or more cloud computing "instances," "containers," and/or "virtual machines," as known in the art.

Referring back to the firmware of the IC, the firmware may control the read performance agent and/or write performance agent to effect timing of measurements and/or location of measurements in the SRAM memory array. For example, measurements may be made for each memory cell, for each group of memory cells (such as a row) or for each bit line. Multiple measurements may be taken from the same or different memory cells and averaged. In some cases, only the best and/or worst measurement taken within a time period may be used.

The firmware may effect measurements and/or reporting dynamically (for example based on a regular or scheduled timeframe) and/or on instruction from the platform. The results may be used to understand the SRAM circuit better, to improve design and/or manufacture of the SRAM circuit, and/or to mitigate the effects of degradation. For example, the firmware may reconfigure the SRAM circuit to limit use of one or more degraded memory cells, such as by using them less frequently or for less important data relative to other, less degraded memory cells of the same IC, based on the results provided. Namely, memory cells that have degraded more than others on the same IC, or whose degradation rate is faster than that of others on the same IC, may be used less frequently than the other memory cells, or not used at all once the degradation measure and/or degradation rate exceed a predefined threshold. An alerts may be issued, either locally in the computer system in which the IC is installed, and/or to the platform, when such threshold is exceeded.

In a further general aspect (which may be combined with any other aspect disclosed herein), there may be considered an Integrated Circuit (IC), comprising: a memory circuit comprising a memory cell array and a memory monitoring agent, the memory monitoring agent being configured to indicate a status of the memory cell array; and firmware, configured to receive the indication of the status of the memory cell array from the memory monitoring agent and advantageously compare the received indication against a reference level. In particular, the memory circuit is optionally in accordance with any such aspect or embodiment disclosed herein. Based on the comparison, further actions may be taken, for example any of the steps or features discussed below.

In embodiments, the firmware is further configured to store the received indication.

Optionally, the IC (for example in the memory circuit) further comprises a write assist circuit, configured to apply a signal to the memory circuit during a write operation. Then, the firmware may be further configured to control the write assist circuit on the basis of the received indication of the status of the memory cell array. For example, if the status of the memory cell array indicates degradation or degradation above a threshold, the write assist circuit may be activated, or a pulse signal generated by the write assist circuit may be lengthened.

A number of further features may be considered in respect of any IC aspect disclosed herein. Beneficially, the memory cell array comprises a plurality of bit lines. Each bit line is coupled to one or more memory cells of the memory cell array. Then, the memory monitoring agent may be configured to indicate a status of the memory cell for each of the plurality of bit lines. Additionally or alternatively, the firmware may be configured to control the memory monitoring agent to determine a plurality of statuses of the memory cell array. It may be configured then to indicate the best and/or worst of the determined plurality of statuses to the firmware.

Optionally, the IC further comprises: a communication interface, configured to provide communication between the firmware and a platform external the IC for communicating the received indication to the platform. In embodiments, the method may additionally comprise adjusting or reconfiguring the memory cell array based on the step of comparing.

A further method aspect may be considered as a method of operating an IC. For example, the method comprises: indicating a status of a memory cell array in the IC; and advantageously comparing the indication of the status of the memory cell array against a reference level at firmware in the IC. Optionally, the step of indicating a status of a memory cell array in the IC comprises any method as herein disclosed. Optionally, memory cell is a RAM cell and further optionally, the RAM cell is an SRAM cell.

Such methods may further comprise storing the indication of the status of the SRAM cell array at the firmware. Advantageously, the memory cell array comprises a plurality of bit lines. Each bit line is coupled to one or more memory cells of the memory cell array. Then, the step of indicating a status of a memory cell array in the IC may comprise indicating a status of the memory cell for each of the plurality of bit lines.

Optionally, a write assist circuit applies a signal to the memory circuit during a write operation. Then, the write assist circuit may be controlled on the basis of the status of the memory cell array (as discussed above).

In some embodiments, the method further comprises: determining a plurality of statuses of the memory cell array. Then, the step of indicating a status of a memory cell array in the IC may comprise indicating the best and/or worst of the determined plurality of statuses.

These methods may further comprise: communicating the indication of the status of the memory cell array from the firmware to a platform external the IC.

Throughout this disclosure, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

In the description and claims of the application, each of the words "comprise" "include" and "have", and forms thereof, are not necessarily limited to members in a list with which the words may be associated. In addition, where there are inconsistencies between this application and any document incorporated by reference, it is hereby intended that the present application controls.

To clarify the references in this disclosure, it is noted that the use of nouns as common nouns, proper nouns, named nouns, and the/or like is not intended to imply that embodiments of the invention are limited to a single embodiment, and many configurations of the disclosed components can be used to describe some embodiments of the invention, while other configurations may be derived from these embodiments in different configurations.

In the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming but would nevertheless be a routine undertaking of engineering for those of ordinary skill in the art having the benefit of this disclosure.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Moreover, the various features and embodiments of the invention described above are specifically contemplated to be used alone as well as in various combinations.

Conventional and/or contemporary circuit design and layout tools may be used to implement the invention. The specific embodiments described herein and, in particular the various thicknesses and compositions of various layers, are illustrative of exemplary embodiments, and should not be viewed as limiting the invention to such specific implementation choices. Accordingly, plural instances may be provided for components described herein as a single instance.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer readable medium includes at least disk, tape, or other magnetic, optical, semiconductor (e.g., flash memory cards, ROM), or electronic medium and a network, wireline, wireless or other communications medium.

The foregoing detailed description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, which are intended to define the scope of this invention. In particular, even though some embodiments are described in the context of a specific SRAM architecture, the teachings of the present invention are believed advantageous for use with other types of RAM or RAM circuitry or architectures, for example Dynamic RAM (DRAM), Synchronous DRAM (SDRAM), Flash memory or Non-Volatile RAM (NVRAM), and/or, in certain cases (for monitoring read operations, for example) in Read-Only Memory (ROM) or ROM circuitry or architectures.

Moreover, the techniques described herein may also be applied to other types of memory circuit applications. A different type of comparator may be considered, for example a triangle-wave linear comparator. Accordingly, other variations, modifications, additions, and improvements may fall within the scope of the invention as defined in the claims that follow.

Embodiments of the present invention may be used to fabricate, produce, and/or assemble integrated circuits and/or products based on integrated circuits.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application, or technical improvement over technologies found in the marketplace, or to enable others of ordinary skill in the art to understand the embodiments disclosed herein.

Some embodiments of the present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. Rather, the computer readable storage medium is a non-transient (i.e., not-volatile) medium.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. The skilled person will appreciate that combinations and sub-combinations of specific features disclosed herein may also be provided, even if not explicitly described.

What is claimed is:

1. A memory circuit, comprising:
   a synchronous memory cell array, configured to receive a clock signal and having address lines and bit lines; and
   a margin agent, configured to receive a signal derived from at least one of the bit lines and to determine a status value of the synchronous memory cell array based on a time duration between a transition of the clock signal and a change on the received signal from at least one of the bit lines due to a signaling on at least one of the address lines.

2. The memory circuit of claim 1, wherein the margin agent is configured to determine a time duration from the change on the received signal to a subsequent transition of the clock signal.

3. The memory circuit of claim 1, further comprising:
   an output stage, coupled to the bit lines of the synchronous memory cell array, the margin agent being configured to receive the signal derived from at least one of the bit lines from the output stage.

4. The memory circuit of claim 3, wherein the output stage comprises a sensing amplifier, configured to amplify a signal received from the bit lines of the synchronous memory cell array and further configured to receive a strobe signal that controls activation of the sensing amplifier at a predetermined time interval after selection of a read operation for the synchronous memory cell array, the margin agent being configured to receive the signal derived from at least one of the bit lines from the sensing amplifier at a time that is after selection of the read operation by less than the predetermined time interval.

5. The memory circuit of claim 1, further comprising:
   a comparator, configured to compare a voltage on one of the bit lines with a reference voltage and provide a comparator output, the margin agent being configured to receive the comparator output as the signal derived from at least one of the bit lines.

6. The memory circuit of claim 5, wherein the reference voltage is adjustable.

7. The memory circuit of claim 6, further comprising:
   a controller, configured to adjust the reference voltage and identify the status value of a memory cell of said array based on the comparator output on adjustment of the reference voltage.

8. The memory circuit of claim 7, wherein the controller is configured to determine the status value of the memory cell corresponding with the reference voltage associated with a change in the comparator output or with a higher value.

9. The memory circuit of claim 8, wherein the controller is configured to store a plurality of status values of the memory cell, each stored status value of the memory cell being measured at a respective time.

10. The memory circuit of claim 5, wherein a memory cell of said array has a standard bit line and an inverse bit line, a signal on the inverse bit line being the logical inverse of a signal on the standard bit line, the memory circuit further comprising:
    a multiplexer, configured to selectively provide the signal on the standard bit line and the signal on the inverse bit line to the comparator, based on at least one of: the signal on the standard bit line, and the signal on the inverse bit line.

11. The memory circuit of claim 5, wherein each memory cell of said array has a respective bit line configured to provide data input/output to the respective memory cell, and wherein the comparator is configured to compare a voltage on one or more of the bit lines with a reference voltage and provide a comparator output that is indicative of a status of one or more of the memory cells of said array.

12. The memory circuit of claim 11, wherein the memory circuit comprises a plurality of comparators, each comparator being configured to compare a voltage on a respective one or more of the bit lines with a respective reference voltage and provide a respective comparator output that is indicative of a status of a respective one or more of the memory cells of said array.

13. The memory circuit of claim 11, wherein the comparator is positioned outside the memory cell array.

14. The memory circuit of claim 13, further comprising:
    a precharge circuit coupled to the bit lines of the memory cells of said array, the comparator being positioned at or adjacent the precharge circuit.

15. The memory circuit of claim 5, wherein the comparator comprises an inverter-based amplifier.

16. The memory circuit of claim 15, wherein the inverter-based amplifier comprises:
    an inverting amplifier, having an input and an output;
    a capacitor coupled at a first end to the input of the inverting amplifier;
    a first signal input port coupled to a second end of the capacitor via a first switch;
    a second signal input port coupled to the second end of the capacitor via a second switch;

a feedback connection, coupling the output of the inverting amplifier to the input of the inverting amplifier via a third switch; and a controller, configured to activate the first and third switches at the same time and to activate the second switch when the first and third switches are deactivated.

17. The memory circuit of claim 16, wherein the inverting amplifier is a first inverting amplifier having a threshold voltage, the memory circuit further comprising:

a second inverting amplifier, configured to receive the output of the first inverting amplifier as an input, a threshold voltage of the second inverting amplifier being equal to the threshold voltage of the first inverting amplifier.

18. The memory circuit of claim 1, wherein the memory cell array is a Random Access Memory (RAM) cell array.

19. The memory circuit of claim 18, wherein the memory cell array is a Static Random Access Memory (SRAM) cell array.

20. An Integrated Circuit (IC), comprising:

the memory circuit of claim 1; and firmware, configured to receive the status value from the margin agent and compare the received status value against a reference level.

21. The IC of claim 20, further comprising:

a write assist circuit, configured to apply a signal to the memory circuit during a write operation; and wherein the firmware is further configured to control the write assist circuit on the basis of the received status value.

22. The IC of claim 20, further comprising:

a communication interface, configured to provide communication between the firmware and a platform external the IC for communicating the received status value to the platform.

* * * * *